United States Patent
Ogiwara

(10) Patent No.: US 9,159,941 B2
(45) Date of Patent: Oct. 13, 2015

(54) ORGANIC ELECTROLUMINESCENCE DEVICE

(75) Inventor: Toshinari Ogiwara, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 750 days.

(21) Appl. No.: 13/354,557

(22) Filed: Jan. 20, 2012

(65) Prior Publication Data

US 2013/0020558 A1    Jan. 24, 2013

(30) Foreign Application Priority Data

Jan. 20, 2011    (JP) ................................ 2011-009659

(51) Int. Cl.
| | |
|---|---|
| *H01L 51/50* | (2006.01) |
| *H01L 51/00* | (2006.01) |
| *C09K 11/06* | (2006.01) |
| *H05B 33/14* | (2006.01) |

(52) U.S. Cl.
CPC ............ *H01L 51/5016* (2013.01); *C09K 11/06* (2013.01); *H01L 51/0061* (2013.01); *H01L 51/0067* (2013.01); *H01L 51/0073* (2013.01); *H05B 33/14* (2013.01); *C09K 2211/1029* (2013.01); *C09K 2211/1044* (2013.01); *C09K 2211/1059* (2013.01); *C09K 2211/1092* (2013.01); *C09K 2211/185* (2013.01); *H01L 51/0072* (2013.01); *H01L 51/0085* (2013.01); *H01L 2251/552* (2013.01)

(58) Field of Classification Search
None
See application file for complete search history.

(56) References Cited

U.S. PATENT DOCUMENTS

2011/0279020 A1* 11/2011 Inoue et al. .................... 313/504

FOREIGN PATENT DOCUMENTS

| | | |
|---|---|---|
| EP | 1 972 619 A1 | 9/2008 |
| JP | 2006-330710 | 12/2006 |
| JP | 2009-004351 | 1/2009 |
| JP | 2010-180204 | 8/2010 |
| WO | WO 03/080760 | 10/2003 |
| WO | WO 2004/034751 | 4/2004 |
| WO | WO 2005/079118 | 8/2005 |
| WO | WO 2008/056746 | 5/2008 |
| WO | WO 2008/105294 | 9/2008 |

(Continued)

OTHER PUBLICATIONS

Keigo Satoh, et al.; "Expression of Thermally-Activated Delayed Fluorescence of High Efficiency and Application Thereof to OLED"; Organic EL Symposium, 2010, S2-5, pp. 11-12.

(Continued)

*Primary Examiner* — Gregory Clark
(74) *Attorney, Agent, or Firm* — Oblon, McClelland, Maier & Neustadt, L.L.P.

(57) ABSTRACT

An organic electroluminescence device includes a pair of electrodes and an organic compound layer between the pair of electrodes. The organic compound layer includes an emitting layer including a host material and a phosphorescent dopant material. The host material is selected from a compound satisfying the following formula (1) with respect to a difference $\Delta ST$ between singlet energy EgS and an energy gap $Eg_{77K}$ at 77K and satisfying the following formula (2) with respect to the singlet energy EgS $$\Delta ST = EgS - Eg_{77K} < 0.4 \text{ (eV)} \tag{1}$$

$$EgS \geq 2.90 \text{ (eV)} \tag{2}$$

20 Claims, 4 Drawing Sheets

(56) References Cited

FOREIGN PATENT DOCUMENTS

| WO | WO 2009/008100 | | 1/2009 | |
|---|---|---|---|---|
| WO | WO 2010/114243 | * | 10/2010 | ............. C09K 11/06 |

OTHER PUBLICATIONS

Katumi Tokumaru; "Organic Photochemical Reaction Theory"; Tokyo Kagaku Dojin Co., Ltd., 1973, pp. 79-82.

Jing Kang, et al.; "Prevention of H-Aggregates Formation in Cy5 Labeled Macromolecules"; International Journal of Polymer Science, 2010, vol. 2010, Article ID 264781, pp. 1-7.

M. Kasha, et al.; "The Exciton Model in Molecular Spectroscopy"; Pure and Applied Chemistry, 1965, vol. 11, pp. 371-392.

Suresh Das, et al.; "Can H-Aggregates Serve as Light-Harvesting Antennae? Triplet-Triplet Energy Transfer between Excited Aggregates and Monomer Thionine in Aersol-OT Solutions"; J. Phys. Chem. B, 1999, vol. 103, pp. 209-215.

Daisuke Yokoyama, et al.; "Horizontal orientation of linear-shaped organic molecules having bulky substituents in neat and doped vacuum-deposited amorphous films"; Organic Electronics, 2009, vol. 10, Issue 1, pp. 127-137.

Daisuke Yokoyama, et al.; "Horizontal molecular orientation in vacuum-deposited organic amorphous films of hole and electron transport materials"; Appl. Phys. Lett., 2008, vol. 93, pp. 173302-1-173302-3.

Daisuke Yokoyama, et al.; "Enhancement of electron transport by horizontal molecular orientation of oxadiazole planar molecules in organic amorphous films"; Appl. Phys. Lett., 2009, vol. 95, pp. 243303-1-243303-3.

Daisuke Yokoyama, et al.; "Parallel Orientation of Molecule in Organic Amorphous Film"; Organic EL Symposium, 2008, S2-2, pp. 5-6.

The Chemical Society of Japan, "Hikarikagaku no Sekai (The world of Photochemistry)"; Dainippon tosho co., Ltd., 1993, pp. 50-54.

Daisuke Yokoyama, et al.; "Orientation Control of Linear-Shaped Molecules in Vacuum-Deposited Organic Amorphous Films and Its Effect on Carrier Mobilities"; Advanced Functional Materials, 2010, vol. 20, Issue 3, pp. 386-391.

Joerg Frischeisen, et al.; "Determination of molecular dipole orientation in doped fluorescent organic thin films by photoluminescence measurements"; Appl. Phys. Lett., 2010, vol. 96, pp. 073302-1-073302-3.

* cited by examiner

F I G . 1
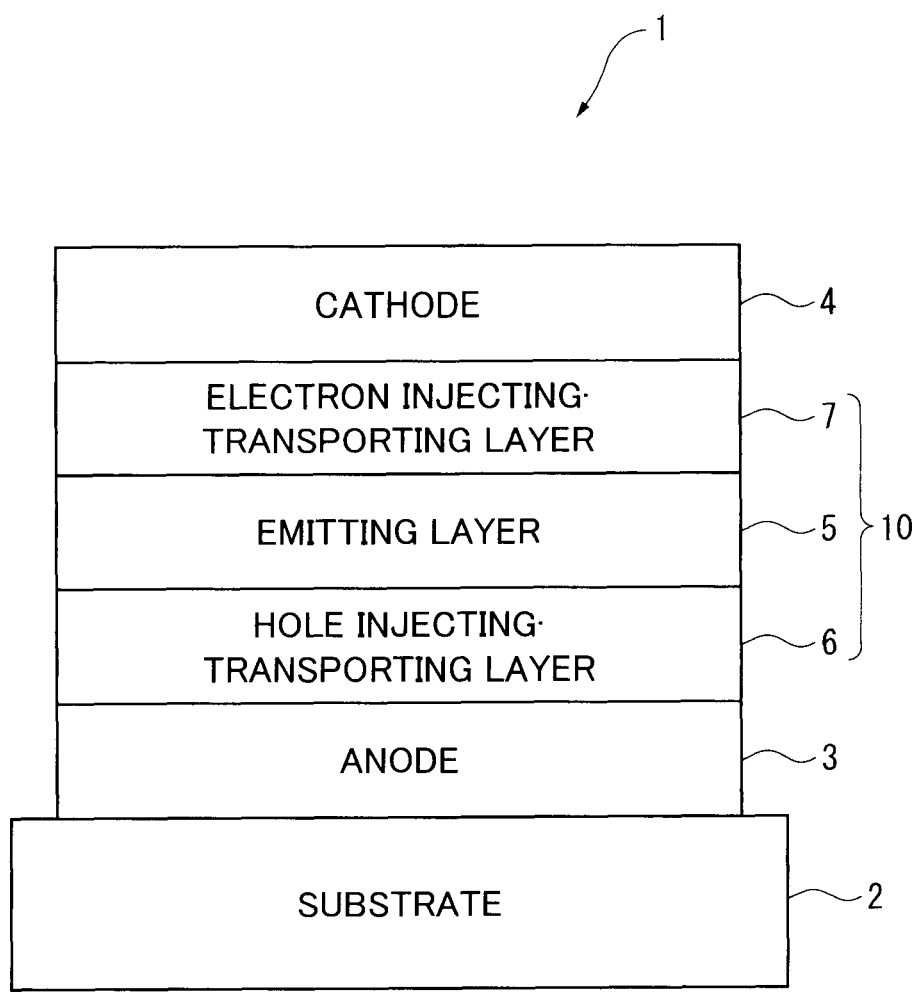

ORGANIC ELECTROLUMINESCENCE DEVICE

The entire disclosure of Japanese Patent Application No. 2011-009659, filed Jan. 20, 2011, is expressly incorporated by reference herein.

TECHNICAL FIELD

The present invention relates to an organic electroluminescence device.

BACKGROUND ART

When a voltage is applied to an organic electroluminescence device (hereinafter referred to as an organic EL device), holes are injected from an anode into an emitting layer and electrons are injected from a cathode into the emitting layer. The injected holes and electrons are recombined in the emitting layer to form excitons. Here, according to the electron spin statistics theory, singlet excitons and triplet excitons are generated at a ratio of 25%:75%. In the classification according to the emission theory, in a fluorescent organic EL device which uses emission caused by singlet excitons, the limit value of an internal quantum efficiency is believed to be 25%. On the other hand, in a phosphorescent EL device which uses emission caused by triplet excitons, it has been known that the internal quantum efficiency can be improved up to 100% when intersystem crossing efficiently occurs from the singlet excitons.

In a typical organic EL device, the most suitable device design has been made depending on fluorescent and phosphorescent emission mechanism. Particularly, when a fluorescent device technique is simply used for designing the phosphorescent organic EL device, it has been known that a highly efficient phosphorescent organic EL device cannot be obtained because of a luminescence property of the phosphorescent organic EL device. The reasons are generally considered as follows.

First of all, since the phosphorescent emission is generated using triplet excitons, an energy gap of a compound for the emitting layer must be large. This is because a value of an energy gap (hereinafter, occasionally referred to as singlet energy) of a compound is typically larger than a value of triplet energy (herein, referred to as an energy gap between energy in the lowest triplet state and energy in the ground state) of the compound.

Accordingly, in order to efficiently trap triplet energy of a phosphorescent dopant material in the device, a host material having larger triplet energy than that of the phosphorescent dopant material needs to be used in the emitting layer. Moreover, an electron transporting layer and a hole transporting layer need to be provided adjacently to the emitting layer. A compound used as the electron transporting layer and the hole transporting layer needs to have a larger triplet energy than that of the phosphorescent dopant material.

When the phosphorescent organic EL device is thus produced according to the designing idea of the typical organic EL device, a compound having a larger energy gap than that of a compound used as a fluorescent organic EL device is used, thereby increasing drive voltage of the overall organic EL device.

Although a hydrocarbon compound exhibiting a high oxidation resistance and a high reduction resistance is useful for the fluorescent device, the hydrocarbon compound has a broad π electron cloud to render the energy gap small. For this reason, such a hydrocarbon compound is unlikely to be selected for the phosphorescent organic EL device, so that an organic compound including a hetero atom (e.g., oxygen and nitrogen) is selected. Consequently, a lifetime of the phosphorescent organic EL device is shorter than that of the fluorescent organic EL device.

Moreover, device performance of the phosphorescent organic EL device is greatly affected by an exciton relaxation rate of triplet excitons much longer than that of singlet excitons in the phosphorescent dopant material. In other words, with respect to emission from the singlet excitons, since a relaxation rate leading to emission is so fast that the singlet excitons are unlikely to diffuse to the neighboring layers of the emitting layer (e.g., the hole transporting layer and the electron transporting layer), efficient emission is expected. On the other hand, since emission from the triplet excitons is spin-forbidden and has slow relaxation rate, the triplet excitons are likely to diffuse to the neighboring layers, so that the triplet excitons are thermally energy-deactivated unless the phosphorescent dopant material is a specific phosphorescent compound. In short, in the phosphorescent organic EL device, control of the recombination region of the electrons and the holes is more important as compared with the control in the fluorescent organic EL device.

For the above reasons, enhancement of the performance of the phosphorescent organic EL device requires material selection and device design different from those of the fluorescent organic EL device.

As an application of the luminous material for realizing the phosphorescent organic EL device having a high luminous efficiency, Document 1 (International Publication No. 2008/056746) discloses an organic EL device having a phosphorescent emitting layer including a specific compound with an indocarbazole skeleton as a host material and a phosphorescent compound ($Ir(ppy)_3$) as a dopant material. Document 1 describes that such an arrangement of the emitting layer allows efficient emission from the dopant material to improve the luminous efficiency of the organic EL device as compared with an arrangement in which the host material is $Alq_3$.

When the specific compound with an indocarbazole skeleton is used as the host material in the phosphorescent emitting layer as described in Document 1, the luminous efficiency of the organic EL device is improved only in comparison with the arrangement in which the host material is $Alq_3$. However, the luminous efficiency is not sufficient for practical use. Accordingly, further enhancement of the luminous efficiency has been desired. Moreover, Document 1 only examines an organic EL device in which $Alq_3$ having an insufficiently large electron mobility is used as an electron transporting layer. Accordingly, an electron transporting layer exhibiting a large electron injecting performance to the emitting layer has been desired in view of application of an emitting layer system exhibiting a high luminous efficiency.

SUMMARY OF THE INVENTION

An object of the invention is to provide a phosphorescent organic EL device having an improved luminous efficiency.

Moreover, an object of the invention is to provide a phosphorescent organic EL device having an improved luminous efficiency even when an electron transporting layer having a large electron mobility is used in the phosphorescent organic EL device.

After conducting concentrated studies in order to solve the above problem, the inventor has found that the luminous efficiency of the phosphorescent organic EL device is improved by using a compound satisfying specific conditions as the host material of the emitting layer, and reached the invention.

An organic EL device according to an aspect of the invention includes a pair of electrodes and an organic compound layer between the pair of electrodes, the organic compound layer including an emitting layer including a host material and a phosphorescent dopant material, in which the host material is selected from a compound satisfying the following formula (1) with respect to a difference ΔST between singlet energy EgS and an energy gap $Eg_{77K}$ at 77K and satisfying the following formula (2) with respect to the singlet energy EgS.

$$\Delta ST = EgS - Eg_{77K} < 0.4 \text{ (eV)} \tag{1}$$

$$EgS \geq 2.90 \text{ (eV)} \tag{2}$$

An organic EL device according to another aspect of the invention includes a pair of electrodes and an organic compound layer between the pair of electrodes, the organic compound layer including an emitting layer including a host material and a phosphorescent dopant material, in which the host material is selected from a compound satisfying the following formula (3) with respect to a difference ΔST between singlet energy EgS and an energy gap $Eg_{77K}$ at 77K and satisfying the following formula (4) with respect to the energy gap $Eg_{77K}$.

$$\Delta ST = EgS - Eg_{77K} < 0.4 \text{ (eV)} \tag{3}$$

$$Eg_{77K} \geq 2.85 \text{ (eV)} \tag{4}$$

An organic EL device according to still another aspect of the invention includes a pair of electrodes and an organic compound layer between the pair of electrodes, the organic compound layer including an emitting layer including a host material and a phosphorescent dopant material, in which the host material is selected from a compound satisfying the following formula (5) with respect to a refractive index $n_Z$ in a direction perpendicular to a silicon substrate surface and a refractive index $n_X$ in a direction parallel to the silicon substrate surface by a spectroscopic ellipsometry and satisfying the following formula (6) with respect to singlet energy EgS.

$$\Delta n = |n_X - n_Z| > 0.04 \tag{5}$$

$$EgS \geq 2.90 \text{ (eV)} \tag{6}$$

An organic EL device according to a further aspect of the invention includes a pair of electrodes and an organic compound layer between the pair of electrodes, the organic compound layer including an emitting layer including a host material and a phosphorescent dopant material, in which the host material is selected from a compound satisfying the following formula (7) with respect to a refractive index $n_Z$ in a direction perpendicular to a silicon substrate surface and a refractive index $n_X$ in a direction parallel to the silicon substrate surface by a spectroscopic ellipsometry and satisfying the following formula (8) with respect to an energy gap $Eg_{77K}$ at 77K.

$$\Delta n = |n_X - n_Z| > 0.04 \tag{7}$$

$$Eg_{77K} \geq 2.85 \text{ (eV)} \tag{8}$$

An organic EL device according to a still further aspect of the invention includes a pair of electrodes and an organic compound layer between the pair of electrodes, the organic compound layer including an emitting layer including a host material and a phosphorescent dopant material, in which the host material is selected from a compound having more than 75 nm of a half bandwidth of photoluminescence spectrum and satisfying the following formula (9) with respect to singlet energy EgS.

$$EgS \geq 2.90 \text{ (eV)} \tag{9}$$

An organic EL device according to a still further aspect of the invention includes a pair of electrodes and an organic compound layer between the pair of electrodes, the organic compound layer including an emitting layer including a host material and a phosphorescent dopant material, in which the host material is selected from a compound having more than 75 nm of a half bandwidth of photoluminescence spectrum and satisfying the following formula (10) with respect to an energy gap $Eg_{77K}$ at 77K.

$$Eg_{77K} \geq 2.85 \text{ (eV)} \tag{10}$$

In the organic EL device according to the above aspect of the invention, the host material is preferably selected from a compound having more than 75 nm of a half bandwidth of photoluminescence spectrum.

In the organic EL device according to the above aspect of the invention, it is preferable that the difference ΔST satisfies the following formula (11).

$$\Delta ST = EgS - Eg_{77K} < 0.3 \text{ (eV)} \tag{11}$$

In the organic EL device according to the above aspect of the invention, it is preferable that a difference ΔT between triplet energy $EgT_D$ of the phosphorescent dopant material and the energy gap $Eg_{77K}$ at 77K of the host material satisfies the following formula (12).

$$\Delta T = Eg_{77K} - EgT_D > 0.20 \text{ (eV)} \tag{12}$$

In the organic EL device according to the above aspect of the invention, preferably, the pair of electrodes are an anode and a cathode, an electron transporting layer is provided between the organic compound layer and the cathode, and an electron mobility of the electron transporting layer is $5 \times 10^{-6}$ $cm^2/Vs$ or more in an electric field intensity of $500(V/cm)^{1/2}$.

In the organic EL device according to the above aspect of the invention, it is preferably that the host material includes at least one of skeletons represented by the following formulae (1) to (8).

(1)

(2)

(3)

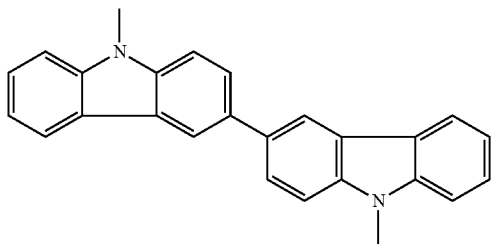

(4)

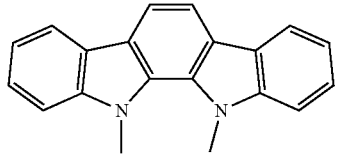

(5)

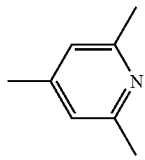

(6)

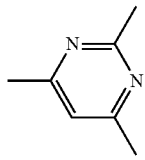

(7)

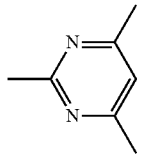

(8)

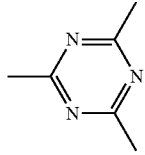

According to the above aspect of the invention, since the aforementioned compounds satisfying specific conditions are used as the host material, a phosphorescent organic EL device having an improved luminous efficiency can be provided.

Moreover, according to the above aspect of the invention, since the aforementioned compounds satisfying specific conditions are used as the host material even when an electron transporting layer having a large electron mobility is used in the phosphorescent organic EL device, the luminous efficiency of the phosphorescent organic EL device can be improved.

BRIEF DESCRIPTION OF DRAWINGS

FIG. 1 schematically shows an exemplary arrangement of an organic electroluminescence device according to a first exemplary embodiment of the invention.

DESCRIPTION OF EMBODIMENT(S)

Figure 2:
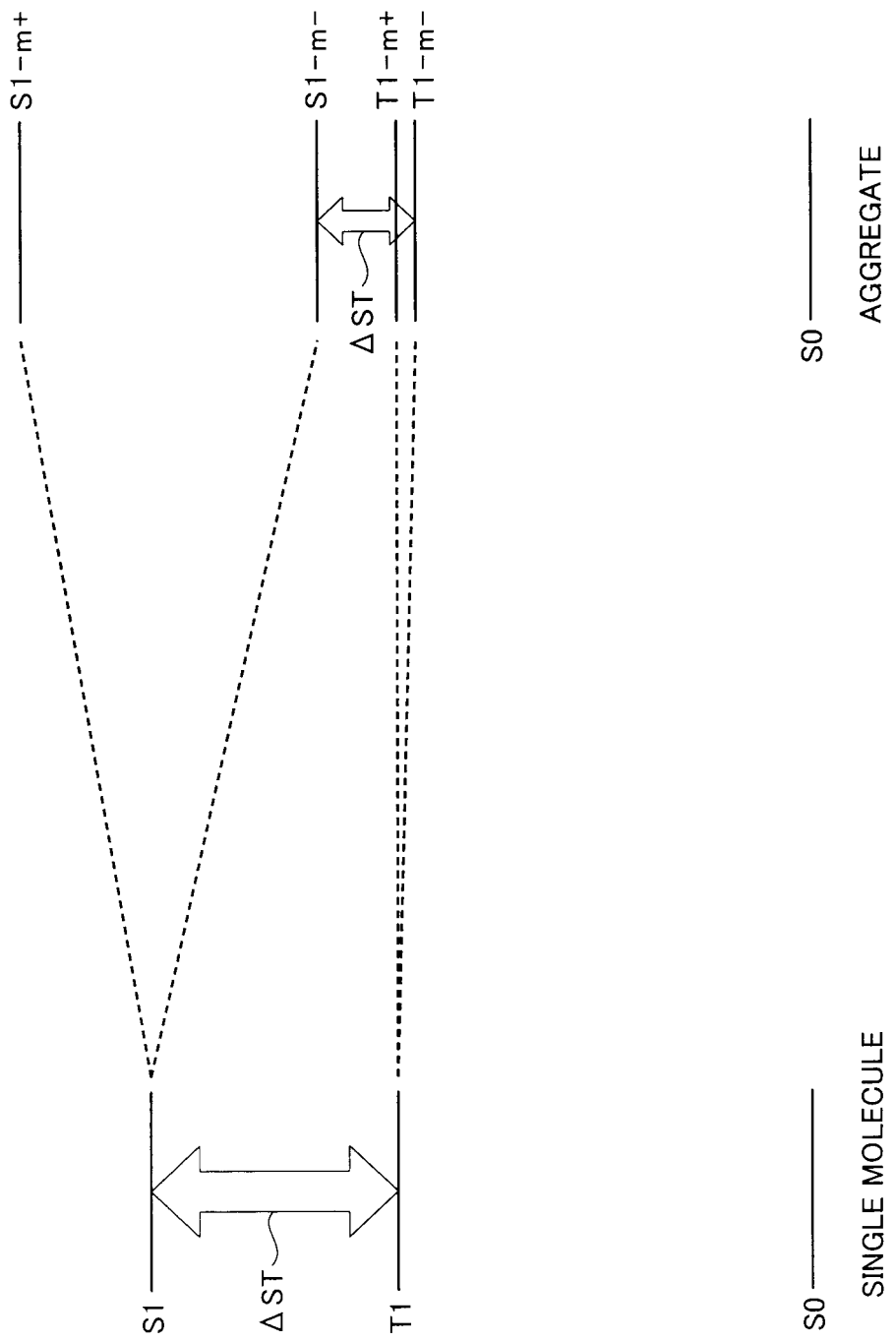
FIG. 2 shows an example of physics models illustrating aggregate formation.

Arrangement(s) of an organic EL device according to an exemplary embodiment will be described below.

The organic EL device of the invention includes a pair of electrodes and an organic compound layer therebetween. The organic compound layer includes at least one layer formed of an organic compound. The organic compound layer may contain an inorganic compound.

In the organic EL device of the invention, at least one layer of the organic compound layer includes an emitting layer. Accordingly, the organic compound layer may be provided by a single emitting layer. Alternatively, the organic compound layer may be provided by layers used in a known organic EL device such as a hole injecting layer, a hole transporting layer, an electron injecting layer, an electron transporting layer, a hole blocking layer, and an electron blocking layer.

The following are representative arrangement examples of the organic EL device:

(a) anode/emitting layer/cathode;

(b) anode/hole injecting-transporting layer/emitting layer/cathode;

(c) anode/emitting layer/electron injecting-transporting layer/cathode;

(d) anode/hole injecting-transporting layer/emitting layer/electron injecting-transporting layer/cathode; and (e) anode/hole injecting-transporting layer/emitting layer/blocking layer/electron injecting-transporting layer/cathode.

While the arrangement (d) is preferably used among the above arrangements, the arrangement of the invention is not limited to the above arrangements.

It should be noted that the aforementioned "emitting layer" is an organic layer generally employing a doping system and including a host material and a dopant material. In general, the host material promotes recombination of electrons and holes and transmits exciton energy generated by recombination to the dopant material. The dopant material is preferably a compound having a high quantum yield. The dopant material exhibits a high luminescent performance after receiving exciton energy from the host material.

The "hole injecting/transporting layer (or hole injecting-transporting layer)" means "at least one of a hole injecting layer and a hole transporting layer while the "electron injecting/transporting layer (or electron injecting-transporting layer)" means "at least one of an electron injecting layer and an electron transporting layer." Herein, when the hole injecting layer and the hole transporting layer are provided, the hole injecting layer is preferably close to the anode. When the electron injecting layer and the electron transporting layer are provided, the electron injecting layer is preferably close to the cathode.

In the invention, the electron transporting layer means an organic layer having the highest electron mobility among organic layer(s) providing an electron transporting zone existing between the emitting layer and the cathode. When the electron transporting zone is provided by a single layer, the single layer is the electron transporting layer. Moreover, in the phosphorescent device, a blocking layer having an electron mobility that is not always high may be provided between the emitting layer and the electron transporting layer as shown in the arrangement (e) in order to prevent diffusion of exciton energy generated in the emitting layer. Thus, the organic layer adjacent to the emitting layer does not always correspond to the electron transporting layer.

FIG. 1 schematically shows an exemplary arrangement of the organic EL device according to the exemplary embodiment of the invention.

An organic EL device 1 includes a light-transmissive substrate 2, an anode 3, a cathode 4 and an organic compound layer 10 interposed between the anode 3 and the cathode 4.

The organic compound layer 10 includes an emitting layer 5 containing a host material and a dopant material. A hole injecting/transporting layer 6 may be provided between the emitting layer 5 and the anode 3 while an electron injecting/transporting layer 7 may be provided between the emitting layer 5 and the cathode 4.

Emitting Layer

In this exemplary embodiment, a compound satisfying specific conditions is used as the host material of the emitting layer as described above. The specific conditions will be described in [1] to [3] below.

[1] ΔST

The inventor has found that a luminous efficiency of the phosphorescent organic EL device is improved when the host material is a compound exhibiting a small energy gap (ΔST) between singlet energy EgS and triplet energy EgT in which the singlet energy EgS is at a predetermined level or more, or when the host material is a compound exhibiting a small energy gap (ΔST) in which the triplet energy EgT is at a predetermined level or more.

From quantum chemical viewpoint, decrease in the energy difference (ΔST) between the singlet energy EgS and the triplet energy EgT can be achieved by a small exchange interaction between the singlet energy EgS and the triplet energy EgT. Physical details of the relationship between ΔST and the exchange interaction are exemplarily described in the following:

Document 2: Organic EL Symposium, proceeding for the tenth meeting edited by Chihaya Adachi et al., S2-5, p 11-12; and Document 3: Organic Photochemical Reaction Theory edited by Katsumi Tokumaru, Tokyo Kagaku Dojin Co., Ltd. (1973). Such a material can be synthesized according to molecular design based on quantum calculation. Specifically, the material is a compound in which a LUMO electron orbit and a HOMO electron orbit are localized to avoid overlapping each other.

When ΔST is decreased, the energy gap between the host material and the electron transporting layer adjacent thereto is decreased. As a result, the electrons are likely to be injected into the emitting layer, thereby lowering the drive voltage of the organic EL device.

Decrease in the energy gap (ΔST) between the singlet energy EgS and the triplet energy EgT can also be achieved by aggregate formation. Herein, the aggregate does not reflect an electronic state by a single molecule, but the aggregate is provided by several molecules physically approaching each other. A value of the energy gap ΔST is considered to be decreased as follows. After a plurality of molecules approach each other, electronic states of the plurality of molecules are mixed with each other to be changed, so that energy levels are changed and a value of singlet energy is mainly decreased, thereby reducing the value of ΔST. The decrease in the value of ΔST by the aggregate formation can also be explained by Davydov splitting model showing that two molecules approach each other to change electronic states thereof (see FIG. 2). As shown in Davydov splitting model, it is considered that change of the electronic states by two molecules different from change of an electronic state by a single molecule is brought about by two molecules physically approaching each other. A singlet state exists in two states represented by $S1-m^+$ and $S1-m^-$. A triplet state exists in two states represented by $T1-m^+$ and $T1-m^-$. Since $S1-m^-$ and $T1-m^-$ showing a lower energy level exist, ΔST representing a gap between $S1-m^-$ and $T1-m^-$ becomes smaller than that in the electronic state by a single molecule.

The Davydov splitting model is exemplarily described in the following:

Document 4: J. Kang, et al, International Journal of Polymer Science, Volume 2010, Article ID 264781;

Document 5: M. Kasha, et al, Pure and Applied Chemistry, Vol. 11, pp 371, 1965; and Document 6: S. Das, et al, J. Phys. Chem. B. vol. 103, pp 209, 1999.

It should be noted that the aggregate according to the exemplary embodiment means that a single molecule forms any aggregate. In other words, a specific aggregate state is not shown in the exemplary embodiment. An aggregate state of organic molecules is stochastically formable in various states in a thin film, which is different from an aggregate state of inorganic molecules.

In this exemplary embodiment, a compound as the host material needs to have a predetermined value or more of the singlet energy EgS or the triplet energy EgT in addition to the conditions on ΔST.

Next, EgS and EgT will be described.

Figure 3:
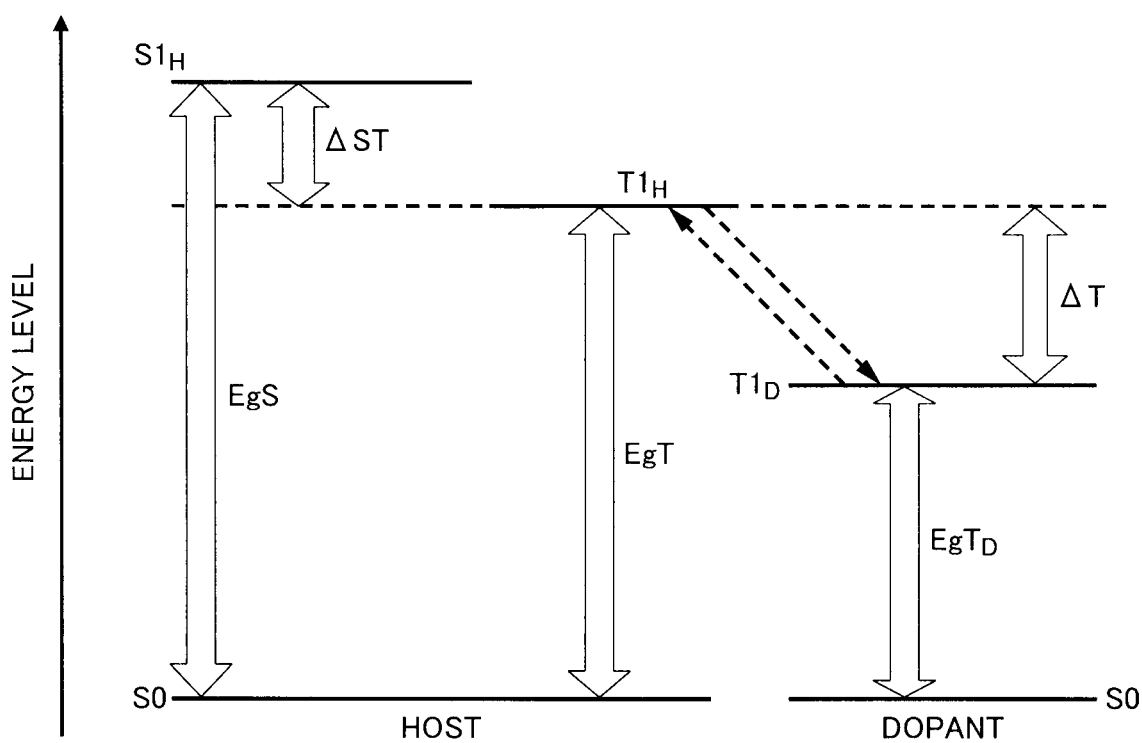
FIG. 3 shows a relationship between an energy level of the host material and an energy level of the dopant material in the emitting layer.

FIG. 3 shows a relationship in energy level between the host material and the dopant material in the emitting layer. In FIG. 3, S0 represents a ground state, $S1_H$ represents a lowest singlet state of the host material, $T1_H$ represents a lowest triplet state of the host material, and $T1_D$ represents a lowest triplet state of the dopant material. As shown in FIG. 3, a difference between $S1_H$ and $T1_H$ corresponds to ΔST and a difference between $T1_H$ and $T1_D$ corresponds to ΔT. A dotted-line arrow shows energy transfer between the respective excited states in FIG. 3.

As described above, a material having a small ΔST is selected as the compound for the host material in the exemplary embodiment. When the energy gap between the lowest triplet state $T1_H$ of the host material and the lowest triplet state $T1_D$ of the dopant material is small, triplet excitons may be transferred from the phosphorescent dopant material to the host material to reduce an efficiency of trapping the triplet excitons. Accordingly, in order to avoid decrease in the luminous efficiency caused by the triplet excitons being transferred from the phosphorescent dopant material to the host material, the energy gap between the lowest triplet state $T1_H$ of the host material and the lowest triplet state $T1_D$ of the dopant material needs to be large.

When molecules form an aggregate as exemplarily shown in the Davydov splitting model, such an aggregate formation causes an excited level to be split. Accordingly, an excited state of $T1-m^-$ showing a low energy level can also exist. Consequently, the energy gap between the lowest triplet state $T1_H$ of the host material and the lowest triplet state $T1_D$ of the dopant material becomes small, so that triplet excitons may be transferred from the phosphorescent dopant material to the host material to reduce the efficiency of trapping the triplet excitons. In other words, a compound capable of easily forming an aggregate in an organic thin film layer may occasionally trap triplet excitons of the dopant material at a high probability according to calculation when the compound is formed of a monomer (a single molecule). Even with this arrangement, when the compound capable of easily forming the aggregate is used as the host material, the energy level of the lowest triplet state of the host material is actually decreased due to the aggregate formation, so that the triplet excitons of the dopant may be unable to be sufficiently trapped.

In this exemplary embodiment, the compound as the host material is selected from a compound having $\Delta ST$ smaller than a predetermined value and having at least one of the singlet energy EgS and the triplet energy EgT being a predetermined value or more. Reduction of the efficiency of trapping the triplet excitons is prevented by using such a compound.

In this exemplary embodiment, the compound having $\Delta ST$ of a predetermined value or less is used. The aforementioned triplet energy EgT is different from a typically defined triplet energy. Such a difference will be described below.

For general measurement of the triplet energy, a target compound to be measured is dissolved in a solvent to form a sample. A phosphorescent spectrum (ordinate axis: phosphorescent luminous intensity, abscissa axis: wavelength) of the sample is measured at a low temperature (77K). A tangent is drawn to the rise of the phosphorescent spectrum on the short-wavelength side. The triplet energy is calculated by a predetermined conversion equation based on a wavelength value at an intersection of the tangent and the abscissa axis.

As described above, the compound for the host material in the exemplary embodiment has a small $\Delta ST$. When $\Delta ST$ is small, intersystem crossing and inverse intersystem crossing are likely to occur even at a low temperature (77K), so that the singlet state and the triplet state coexist. As a result, the spectrum to be measured in the same manner as the above includes emission from both the singlet state and the triplet state. Although it is difficult to distinguish emission from the singlet state from emission from the triplet state, the value of the triplet energy is basically considered dominant.

Accordingly, in order to distinguish the triplet energy EgT in the exemplary embodiment from the typical triplet energy EgT in a strict meaning although the measurement method is the same, the triplet energy EgT in the exemplary embodiment is defined as follows. A target compound to be measured is dissolved in a solvent to form a sample. A phosphorescent spectrum (ordinate axis: phosphorescent luminous intensity, abscissa axis: wavelength) of the sample is measured at a low temperature (77K). A tangent is drawn to the rise of the phosphorescent spectrum on the short-wavelength side. Energy is calculated as an energy gap $Eg_{77K}$ by a predetermined conversion equation based on a wavelength value at an intersection of the tangent and the abscissa axis. $\Delta ST$ is defined as a difference between the singlet energy EgS and the energy gap $Eg_{77K}$.

The triplet energy measured in a solution state may include an error by interaction between the target molecule and the solvent. Accordingly, as an ideal condition, a measurement in a thin film state is desired in order to avoid the interaction between the target molecule and the solvent. In this exemplary embodiment, the molecule of the compound used as the host material exhibits a photoluminescence spectrum having a broad half bandwidth in a solution state, which strongly implies aggregate formation also in the solution state. Accordingly, the solution state is considered to be under the same conditions as in a thin film state. Consequently, in this exemplary embodiment, a measurement value of the triplet energy in the solution state is used.

The singlet energy EgS in the exemplary embodiment is defined based on calculation by a typical method. Specifically, the target compound is evaporated on a quartz substrate to prepare a sample. An absorption spectrum (ordinate axis: absorbance, abscissa axis: wavelength) of the sample is measured at a normal temperature (300K). A tangent is drawn to the rise of the absorption spectrum on the long-wavelength side. The singlet energy EgS is calculated by a predetermined conversion equation based on the wavelength value at the intersection of the tangent and the abscissa axis. EgS in aggregate formation corresponds to an energy gap between S1–m$^-$ and the ground state S0 in the Davydov splitting model.

The calculation of the singlet energy EgS and the energy gap $Eg_{77K}$ will be described in detail later.

Thus, with use of a compound having $\Delta ST$ smaller than the value defined in the formula (1) or (3), preferably smaller than the value defined in the formula (11) and having the singlet energy EgS of 2.90 eV or more or the energy gap $Eg_{77K}$ of 2.85 eV or more as the host material in the exemplary embodiment, energy transfer from the phosphorescent dopant material is prevented to improve the luminous efficiency of the organic EL device.

[2] $\Delta n$

The inventor has found that a luminous efficiency of the phosphorescent organic EL device is improved when using as the host material a compound exhibiting a predetermined value of a difference $\Delta n$ between a refractive index $n_Z$ in a direction perpendicular to a silicon substrate surface and a refractive index $n_X$ in a direction parallel to the silicon substrate surface in the spectroscopic ellipsometry measurement and having a predetermined value or more of the singlet energy EgS, or when using as the host material a compound exhibiting a predetermined value of the refractive-index difference $\Delta n$ and a predetermined value or more of the triplet energy EgT.

Herein, $\Delta n$ is a value representing the largest difference between the refractive index $n_Z$ in a direction perpendicular to the silicon substrate surface and the refractive index $n_X$ in a direction parallel to the silicon substrate surface in a region of 0.001 or less of an extinction coefficient in the spectroscopic ellipsometry measurement (measurement range: 200 nm to 1000 nm). The measurement range of the wavelength by the spectroscopic ellipsometry measurement is preferably in a range of 600 nm to 800 nm. Herein, $\Delta n$ is defined as a value at a wavelength of 700 nm.

The inventor has found that one way to reduce $\Delta ST$ is to use the compound forming the aggregate and that the compound having a large $\Delta n$ easily forms the aggregate in a film of the compound. A relationship between $\Delta n$ and easy formability of the aggregate is estimated as follows.

When there is a large difference between a refractive index n in a vertical direction z relative to the silicon substrate and a refractive index n in a parallel direction x relative to the silicon substrate, it is considered that molecules exist with a certain regularity in a thin film state. In other words, the compound used as the host material in the exemplary embodiment is expected to have a predetermined value of $\Delta n$ while forming the aggregate in the thin film state to exhibit a certain regularity.

On the other hand, a compound having an extremely small $\Delta n$ (e.g., CBP and $Alq_3$) exists in an amorphous state in which molecules have no regularity in a thin film state.

The relationship between $\Delta n$ and easy formability of the aggregate is described in the following:

Document 7: D. Yokoyama et al., Org. Electron. 10, 127-137 (2009);

Document 8: D. Yokoyama et al., Appl. Phys. Lett. 93, 173302 (2008); and

Document 9: D. Yokoyama et al., Appl. Phys. Lett. 95, 243303 (2009).

As defined in the above formula (5) or (7), the compound having Δn larger than 0.04 easily forms the aggregate in the film to decrease ΔST by aggregate formation. When ΔST is decreased, the energy gap between the host material and the electron transporting layer adjacent thereto is decreased. As a result, the electrons are likely to be injected into the emitting layer, thereby lowering the drive voltage of the organic EL device.

In this exemplary embodiment, the compound as the host material satisfies the same conditions as those described in the above [1] on the singlet energy EgS and the triplet energy EgT in addition to the conditions on Δn.

Thus, when the compound having Δn larger than 0.04 and having the singlet energy EgS of 2.90 eV or more or the energy gap $Eg_{77K}$ of 2.85 eV or more is used as the host material in the exemplary embodiment, energy transfer from the phosphorescent dopant material is prevented to improve the luminous efficiency of the organic EL device.

[3] Half Bandwidth

The inventor has found that a luminous efficiency of the phosphorescent organic EL device is improved when using as the host material a compound exhibiting a predetermined value of a half bandwidth of a photoluminescence spectrum and a predetermined value or more of the singlet energy EgS, or when using as the host material a compound exhibiting a predetermined value of the half bandwidth of the photoluminescence spectrum and a predetermined value or more of the triplet energy EgT.

The inventor has found that one way to decrease ΔST is to use the compound forming the aggregate and that the compound having a large half bandwidth of the photoluminescence spectrum easily forms the aggregate in a film of the compound. A relationship between half bandwidth of the photoluminescence spectrum and easy formability of the aggregate is estimated as follows.

In a compound having a property of typically existing as a single molecule without forming an aggregate, a vibrational level is less recognized in the singlet state, so that a narrow half bandwidth of the photoluminescence spectrum is observed. For instance, CBP exhibits a property to typically exist as a single molecule, in which a half bandwidth of a photoluminescence spectrum is relatively narrow as much as about 50 nm.

On the other hand, in the compound easily forming the aggregate, a plurality of molecules electronically influence each other, whereby a lot of vibrational levels exist in the singlet state. As a result, since the vibrational levels of the singlet state are often relaxed to the ground state, the half bandwidth of the photoluminescence spectrum is increased.

Since a compound having a large half bandwidth of the photoluminescence spectrum easily forms an aggregate, the compound exhibits a small ΔST similarly to the compound in the above [1]. When ΔST is decreased, the energy gap between the host material and the electron transporting layer adjacent thereto is decreased. As a result, the electrons are likely to be injected into the emitting layer, thereby lowering the drive voltage of the organic EL device.

Since the compound used as the host material has the singlet energy EgS of 2.90 eV or more or the energy gap $Eg_{77K}$ of 2.85 eV or more in the same manner as in the above [1] in addition to the condition on the half bandwidth, energy transfer from the phosphorescent dopant material is prevented to improve the luminous efficiency.

As described in the above [1] to [3], when the compound used as the host material of the organic EL device in the exemplary embodiment is selected based on ΔST, Δn or the half bandwidth, the compound easily forms the aggregate.

When the compound used as the host material is selected from the compound having a predetermined value or more of the singlet energy EgS or the triplet energy EgT in addition to the conditions on ΔST, Δn or the half bandwidth, the luminous efficiency of the organic EL device is improved.

The compound used as the host material in the exemplary embodiment is not limited to a compound in which all molecules form an aggregate in the emitting layer. For instance, some molecules may exist singularly without forming an aggregate. In other words, aggregates and non-aggregates may exist together in the emitting layer.

As long as the compound has a small ΔST even when forming no aggregate in the emitting layer, the compound is usable as the host material in the exemplary embodiment.

The compound used as the host material in the exemplary embodiment preferably has at least one of skeletons represented by the above formulae (1) to (8) in addition to the above specific conditions.

Examples of the compound used as the host material in the exemplary embodiment are shown below. However, the host material in the exemplary embodiment is not limited thereto.

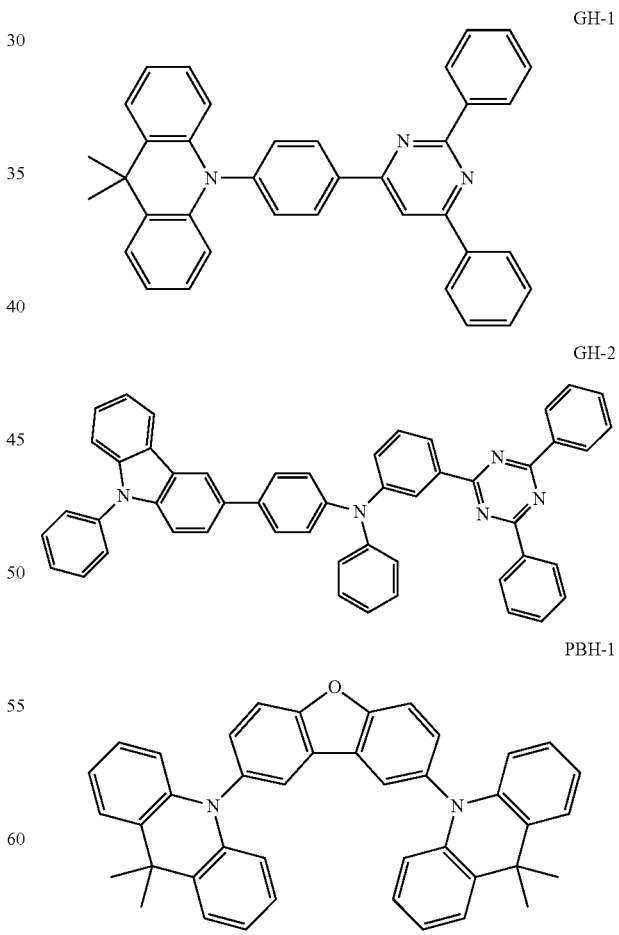

Examples of the compound having a small ΔST, which is used as the host material in the exemplary embodiment, are compounds in which a donor element is bonded to an acceptor element in a molecule and ΔST is in a range of 0.3 eV to 0.4 eV in terms of electrochemical stability (oxidation-reduction stability).

Preferable examples of the donor element are a carbazole structure and an arylamine structure.

Preferable examples of the acceptor element are an azine ring portion, an aza-aromatic ring, an aza-oxygen-containing ring, CN-substituted aromatic ring and ketone-containing ring.

Bonding the donor element to the acceptor element means bonding by various linking groups. Preferable examples of the linking group are a single bond, a phenylene structure and metabiphenylene structure. A compound having ΔST of less than 0.3 eV also becomes usable as the host material in the exemplary embodiment when the compound is quantum-chemically observed based on the disclosure of the exemplary embodiment of the invention and is optimized.

A more preferable compound is such a compound that dipoles formed in the excited state of a molecule interact with each other to form an aggregate having a reduced exchange interaction energy. According to analysis by the inventor, orientation of the dipoles in the compound is substantially aligned in the same direction, so that ΔST can be further reduced by the interaction of the molecules. In such a case, ΔST can be extremely small at 0 to 0.3 eV.

In this exemplary embodiment, the phosphorescent dopant material is used as the dopant material of the emitting layer as described above.

It is preferable that a difference ΔT between triplet energy $EgT_D$ of the phosphorescent dopant material and the energy gap $Eg_{77K}$ of the host material satisfies the formula (12). When ΔT is larger than 0.20 eV as shown by the formula (12), the efficiency of trapping the triplet excitons is improved.

In the emitting layer, a ratio of the host material and the phosphorescent dopant material is preferably in a range of 99:1 to 50:50 at a mass ratio.

The phosphorescent dopant material preferably contains a metal complex. The metal complex preferably contains: a metal atom selected from iridium (Ir), platinum (Pt), osmium (Os), gold (Au), rhenium (Re) and ruthenium (Ru); and a ligand. Particularly, the ligand and the metal atom preferably form an ortho-metal bond.

The phosphorescent dopant material is preferably a compound containing a metal selected from iridium (Ir), osmium (Os) and platinum (Pt) because such a compound exhibits high phosphorescence quantum yield and can further enhance external quantum efficiency of the emitting device. The phosphorescent material is more preferably a metal complex such as an iridium complex, an osmium complex or a platinum complex, among which an iridium complex and a platinum complex are further preferable and ortho metalation of an iridium complex is the most preferable. In terms of the luminous efficiency, an organic metal complex including the ligand selected from phenyl quinoline, phenyl isoquinoline, phenyl pyridine, phenyl pyrimidine, phenyl pyrazine and phenyl imidazole is preferable.

Examples of the phosphorescent dopant material are shown below, but the phosphorescent dopant material is not limited thereto.

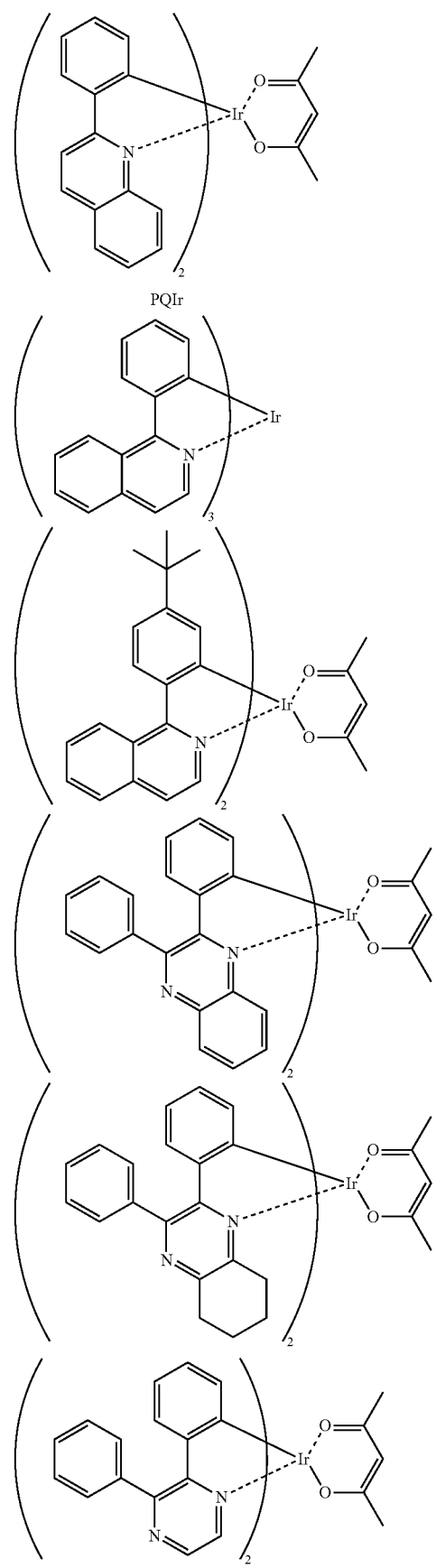

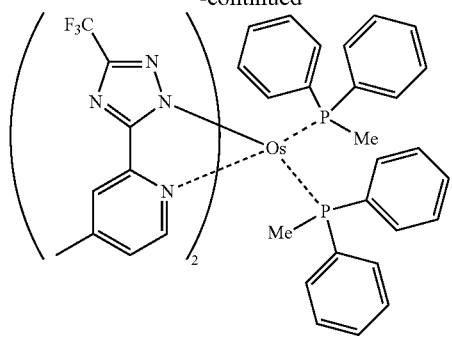
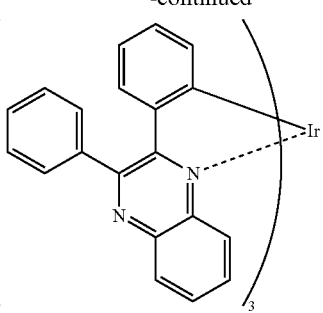
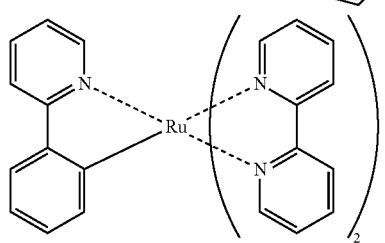
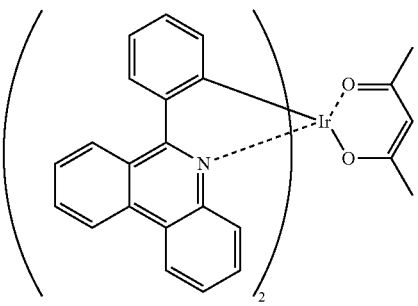
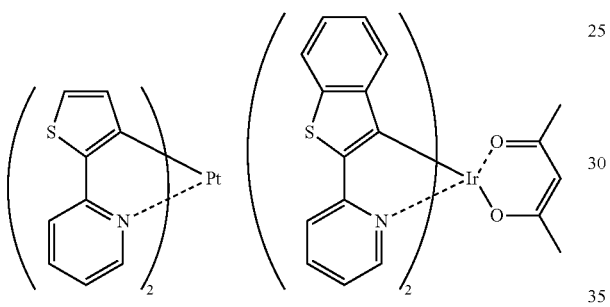
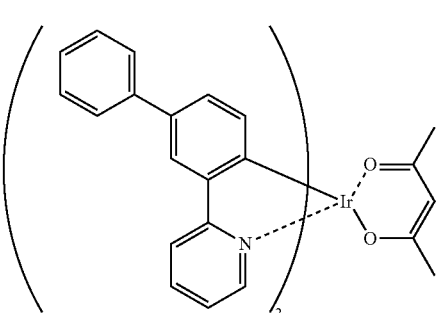
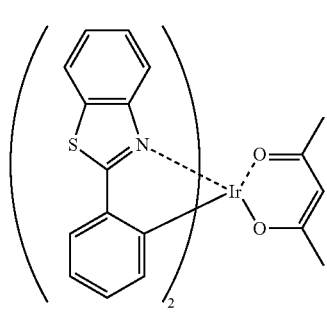
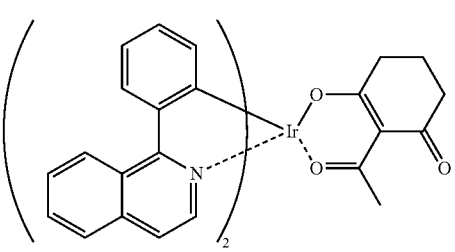
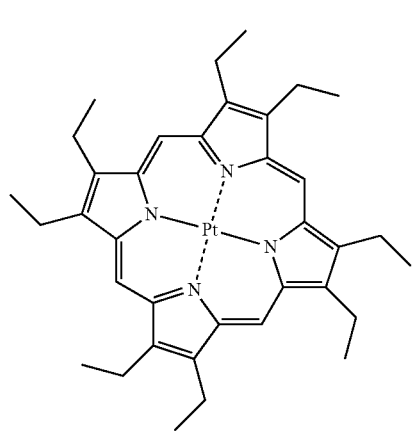
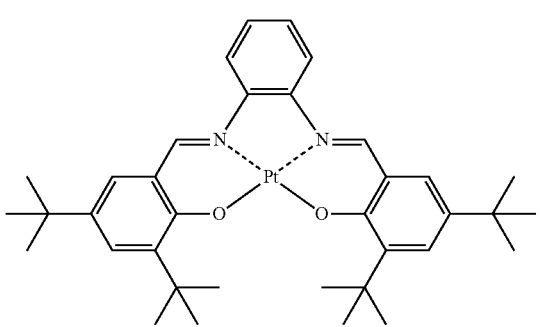

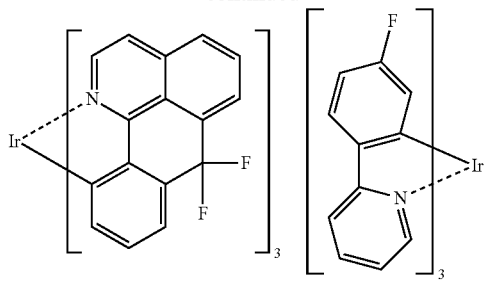
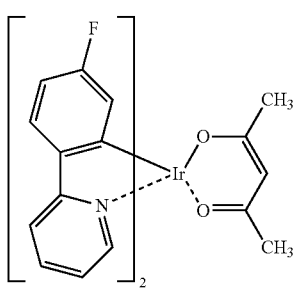
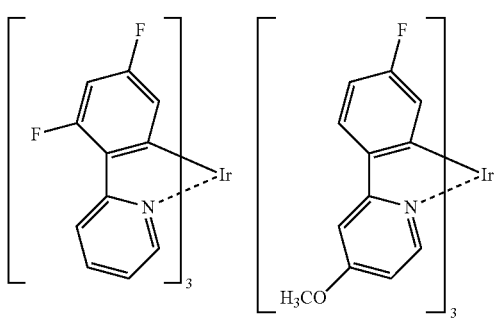
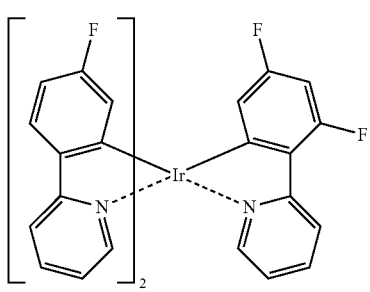
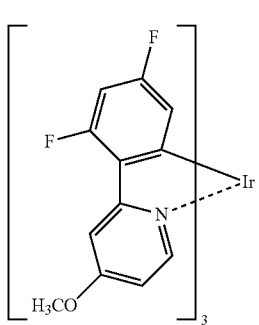
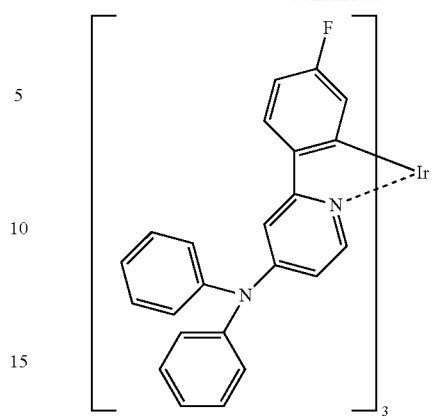
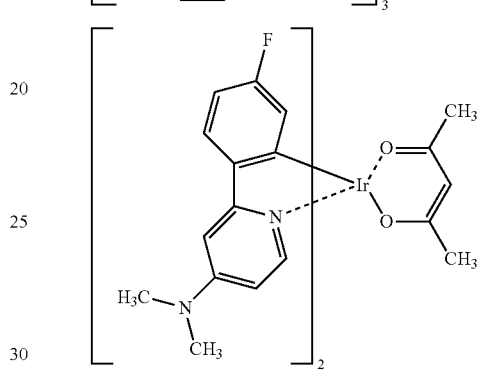
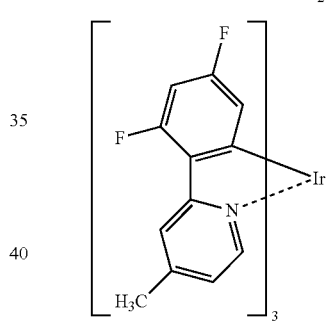
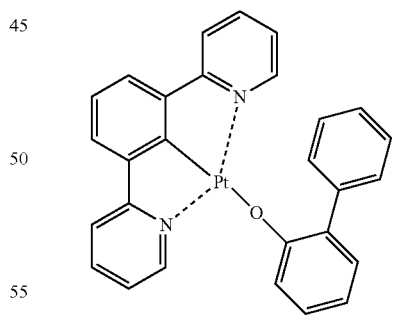
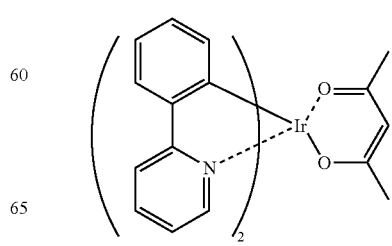

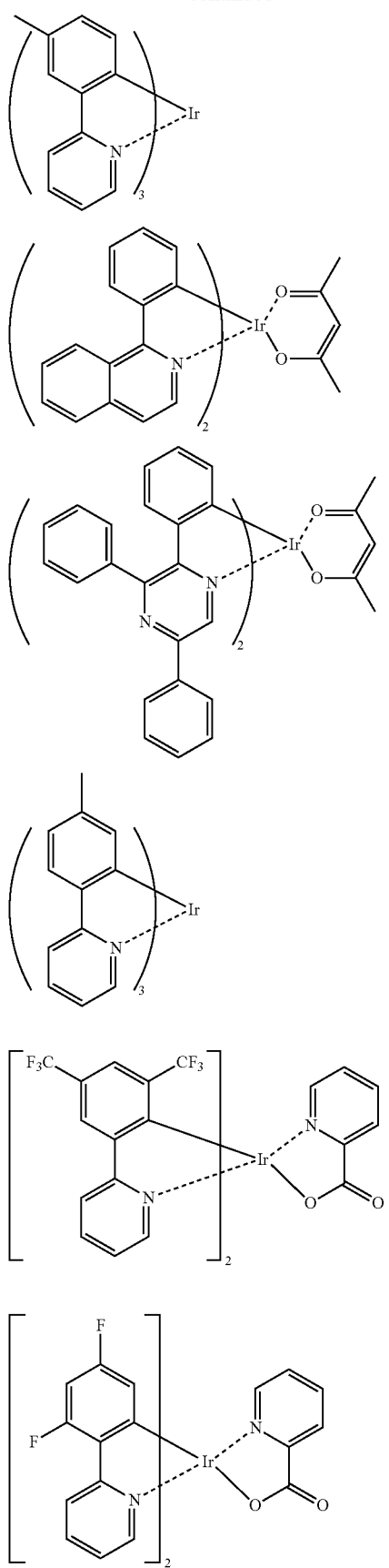
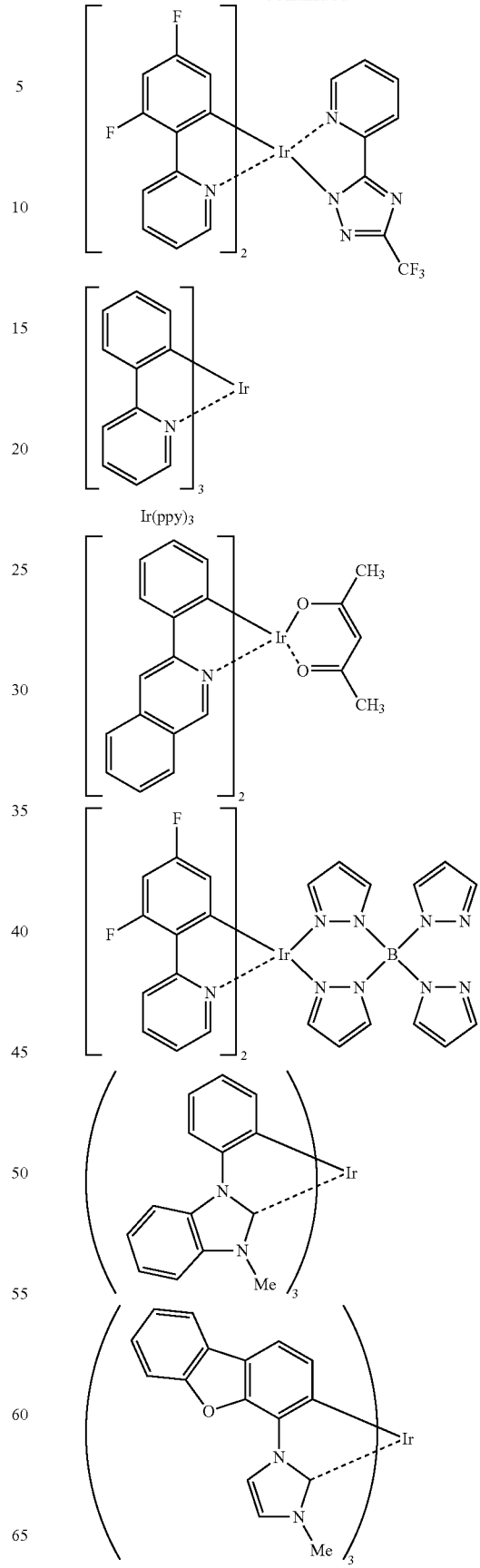

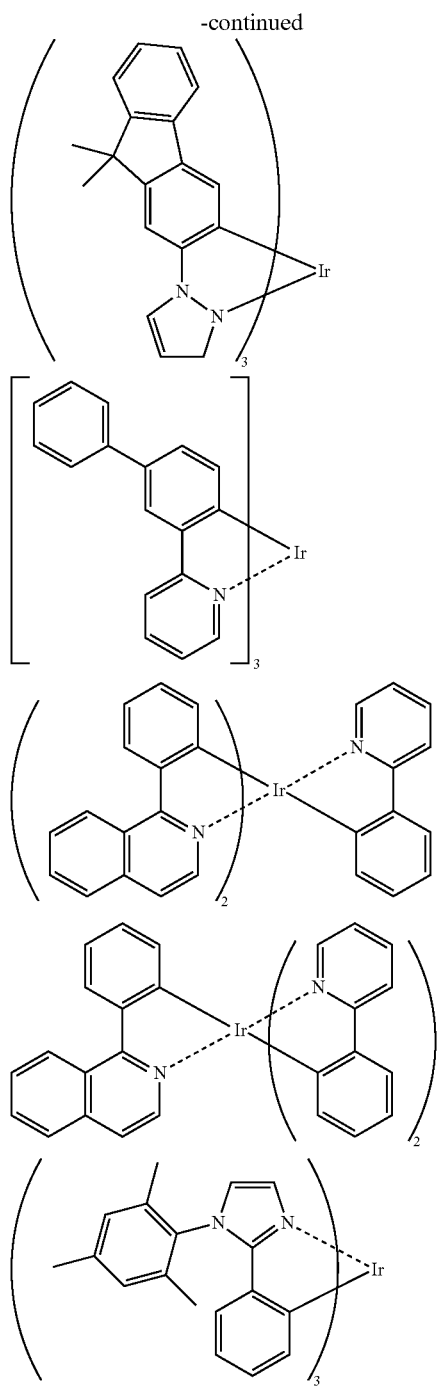

A thickness of the emitting layer is preferably in the range of 5 nm to 50 nm, more preferably in the range of 7 nm to 50 nm and most preferably in the range of 10 nm to 50 nm. The thickness of less than 5 nm may cause difficulty in forming the emitting layer and in controlling chromaticity, while the thickness of more than 50 nm may raise drive voltage.

Substrate

The organic EL device in the exemplary embodiment is prepared on a light-transmissive substrate. The light-transmissive substrate supports an anode, an organic compound layer, a cathode and the like of the organic EL device. The light-transmissive substrate is preferably a flat and smooth substrate that transmits 50% or more of light in a visible region of 400 nm to 700 nm.

The light-transmissive plate is exemplarily a glass plate, a polymer plate or the like.

The glass plate is formed of soda-lime glass, barium/strontium-containing glass, lead glass, aluminosilicate glass, borosilicate glass, barium borosilicate glass, quartz and the like.

The polymer plate is formed of polycarbonate, acryl, polyethylene terephthalate, polyether sulfide and polysulfone.

Anode and Cathode

The anode of the organic EL device injects holes into the emitting layer, so that it is efficient that the anode has a work function of 4.5 eV or higher.

Exemplary materials for the anode are indium-tin oxide (ITO), tin oxide (NESA), indium zinc oxide, gold, silver, platinum and copper.

When light from the emitting layer is to be emitted through the anode, the anode preferably transmits more than 10% of the light in the visible region. Sheet resistance of the anode is preferably several hundreds Ω/sq. or lower. The thickness of the anode is typically in the range of 10 nm to 1 μm, and preferably in the range of 10 nm to 200 nm, though it depends on the material of the anode.

The cathode is preferably formed of a material with smaller work function in order to inject electrons into the emitting layer.

Although a material for the cathode is subject to no specific limitation, examples of the material are indium, aluminum, magnesium, alloy of magnesium and indium, alloy of magnesium and aluminum, alloy of aluminum and lithium, alloy of aluminum, scandium and lithium, and alloy of magnesium and silver.

Like the anode, the cathode may be made by forming a thin film on, for instance, the electron transporting layer and the electron injecting layer by a method such as vapor deposition. In addition, the light from the emitting layer may be emitted through the cathode. When light from the emitting layer is to be emitted through the cathode, the cathode preferably transmits more than 10% of the light in the visible region.

Sheet resistance of the cathode is preferably several hundreds Ω/sq. or lower.

The thickness of the cathode is typically in the range of 10 nm to 1 μm, and preferably in the range of 50 nm to 200 nm, though it depends on the material of the cathode.

Hole Injecting/Transporting Layer

The hole injecting/transporting layer helps injection of holes to the emitting layer and transports the holes to an emitting region. A compound having a large hole mobility and a small ionization energy is used as the hole injecting/transporting layer.

A material for forming the hole injecting/transporting layer is preferably a material of transporting the holes to the emitting layer at a lower electric field intensity. For instance, an aromatic amine compound is preferably used.

Electron Injecting/Transporting Layer

The electron injecting/transporting layer helps injection of the electrons into the emitting layer and transports the electrons to an emitting region. A compound having a large electron mobility is used as the electron injecting/transporting layer.

A preferable example of the compound used as the electron injecting/transporting layer is an aromatic heterocyclic compound having at least one heteroatom in a molecule. Particularly, a nitrogen-containing cyclic derivative is preferable. The nitrogen-containing cyclic derivative is preferably a heterocyclic compound having a nitrogen-containing six-membered or five-membered ring skeleton.

When an electron transporting layer is provided in the organic EL device in the exemplary embodiment, an electron mobility of the electron transporting layer is preferably $5\times10^{-6}$ cm$^2$/Vs or more in the electric field intensity of 500 (V/cm)$^{1/2}$. With this electron mobility, electron injection to the emitting layer is promoted and the drive voltage of the organic EL device is decreased.

In the organic EL device in the exemplary embodiment, in addition to the above exemplary compound, any compound selected from compounds known as being used in the typical organic El device is usable as a compound for the organic compound layer other than the emitting layer.

A method for forming each layer of the organic EL device in the exemplary embodiment is subject to no limitation except for the above particular description. However, known methods of dry film-forming such as vacuum deposition, sputtering, plasma or ion plating and wet film-forming such as spin coating, dipping, flow coating or ink-jet are applicable.

The thickness of each organic layer of the organic EL device in the exemplary embodiment is subject to no limitation except for the thickness particularly described above. However, the thickness is typically preferably in a range of several nanometers to 1 μm because an excessively thin film is likely to entail defects such as a pin hole while an excessively thick film requires high applied voltage and deteriorates efficiency.

Modification(s)

It should be noted that the invention is not limited to the above exemplary embodiment but may include any modification and improvement as long as such modification and improvement are compatible with the invention.

For instance, an electron blocking layer may be provided to the emitting layer adjacent to the anode while a hole blocking layer may be provided to the emitting layer adjacent to the cathode. With this arrangement, the electrons and the holes can be trapped in the emitting layer, thereby enhancing probability of exciton generation in the emitting layer.

The emitting layer is not limited to a single layer, but may be provided as laminate by a plurality of emitting layers. When the organic EL device includes the plurality of emitting layers, it is only required that at least one of the emitting layers includes the host material and the phosphorescent dopant material defined in the invention. The rest of the emitting layers may be a fluorescent emitting layer or a phosphorescent emitting layer.

When the organic EL device includes the plurality of emitting layers, the plurality of emitting layers may be adjacent to each other, or may be laminated on each other via a layer other than the emitting layers (e.g., a charge generating layer).

Further, the materials and treatments for practicing the invention may be altered to other arrangements and shapes as long as such other arrangements and shapes are compatible with the invention.

EXAMPLES

Examples of the invention will be described below. However, the invention is not limited by these Examples.

Used compounds are as follows.

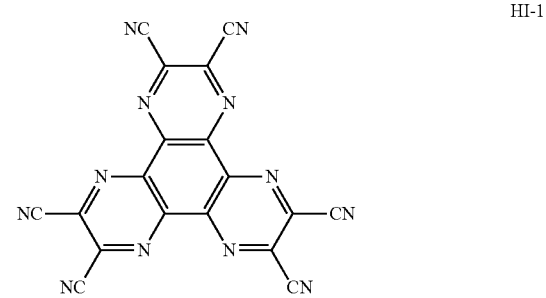

HI-1

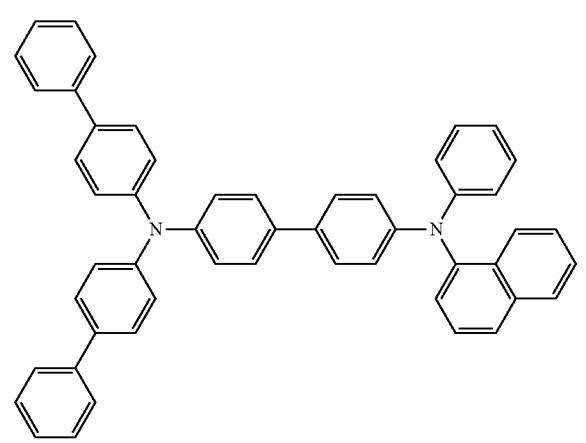

HT-1

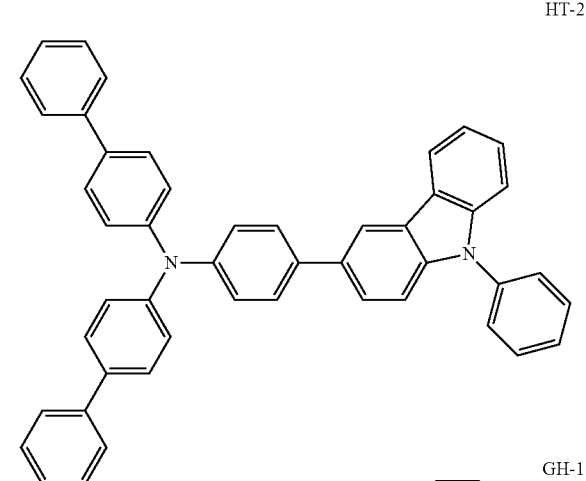

HT-2

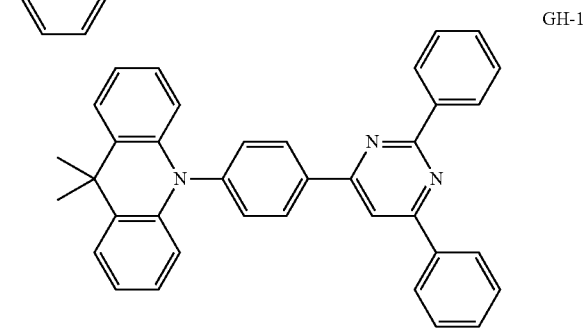

GH-1

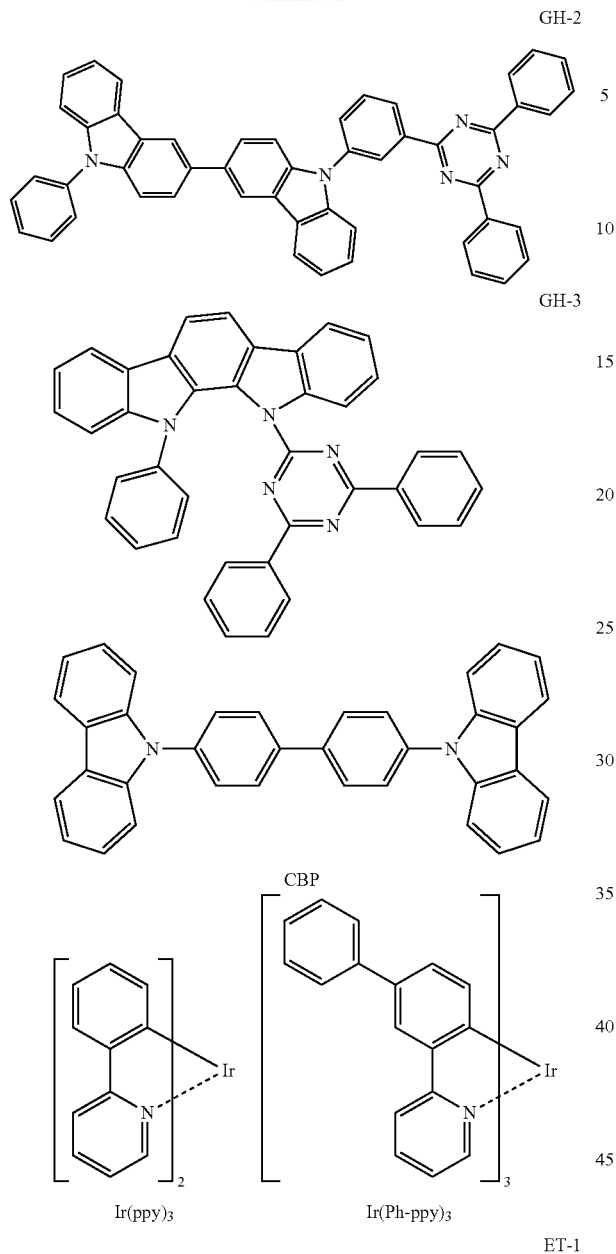

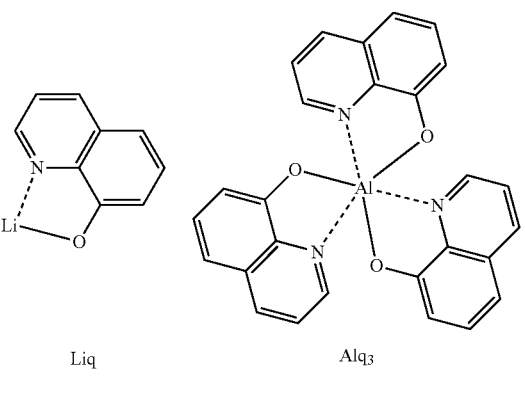

Synthesis of Compound(s)

Synthesis Example 1

Synthesis of GH-1

Under an argon gas atmosphere, an intermediate A (2.3 g, 11 mmol) synthesized according to the method described in JP-A-2010-180204, an intermediate B (3.9 g, 10 mmol) synthesized according to the method described in International Publication No. 2003/080760 (WO03/080760 A1), tris (dibenzylidene acetone)dipalladium (0.18 g, 0.2 mmol), tri-t-butylphosphonium tetrafluoroborate (0.12 g, 0.4 mmol), t-butoxysodium (1.35 g, 14 mmol) and anhydrous toluene (80 ml) were sequentially added and refluxed for eight hours.

After the reaction solution was cooled down to the room temperature, an organic layer was separated and an organic solvent was distilled away under reduced pressure. The obtained residue was refined by silica-gel column chromatography, so that a compound GH-1 (2.8 g, a yield of 54%) was obtained.

As a result of FD-MS (Field Desorption Mass Spectrometry: hereinafter abbreviated to FD-MS) analysis, m/e was equal to 515 while a calculated molecular weight was 515.

A synthesis scheme of the compound GH-1 is shown below.

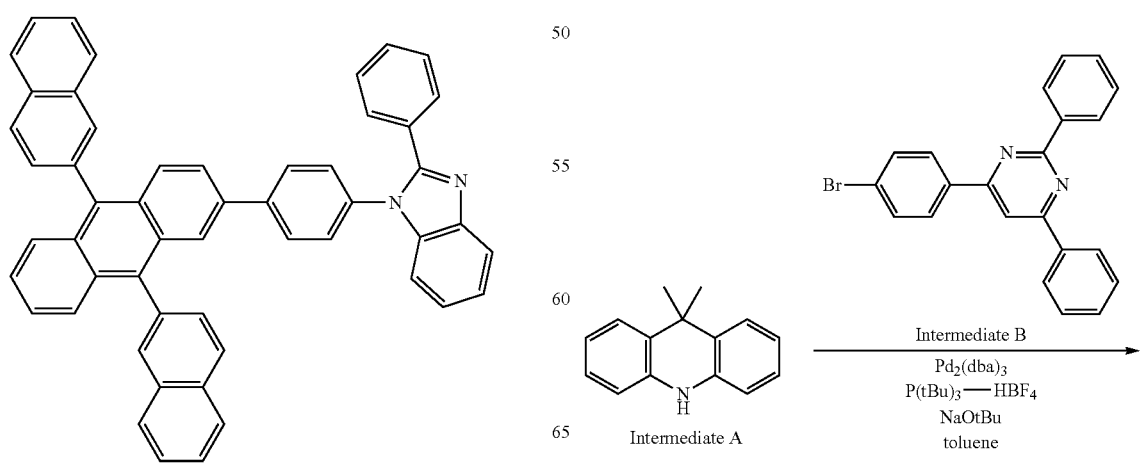

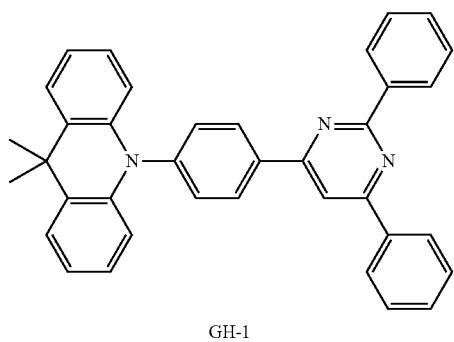

GH-1

Synthesis Example 2

Synthesis of GH-2

3-bromobenzaldehyde (18.4 g, 100 mmol) was dissolved in ethanol (500 ml), to which benzamidine hydrochloride (31.2 g, 200 mmol) and sodium hydroxide (8 g, 200 mmol) were added and refluxed for eight hours. After the reaction solution was cooled down to the room temperature, toluene and water were added to the reaction solution. An organic layer was separated and an organic solvent was distilled away under reduced pressure. The obtained residue was refined by silica-gel column chromatography, so that an intermediate C (9.3 g, a yield of 24%) was obtained.

Under an argon gas atmosphere, the intermediate C (1.5 g, 3.9 mmol), an intermediate D (1.6 g, 3.9 mmol) synthesized according to the method described in European Patent Application Publication No. 1972619 (EP1972619 A1), tris(dibenzylidene acetone)dipalladium (0.071 g, 0.078 mmol), tri-t-butylphosphonium tetrafluoroborate (0.091 g, 0.31 mmol), t-butoxysodium (0.53 g, 5.5 mmol) and anhydrous toluene (20 ml) were sequentially added and refluxed for eight hours.

After the reaction solution was cooled down to the room temperature, an organic layer was separated and an organic solvent was distilled away under reduced pressure. The obtained residue was refined by silica-gel column chromatography, so that a compound GH-2 (2.3 g, a yield of 82%) was obtained.

As a result of FD-MS analysis, m/e was equal to 715 while a calculated molecular weight was 715.

A synthesis scheme of the compound GH-2 is shown below.

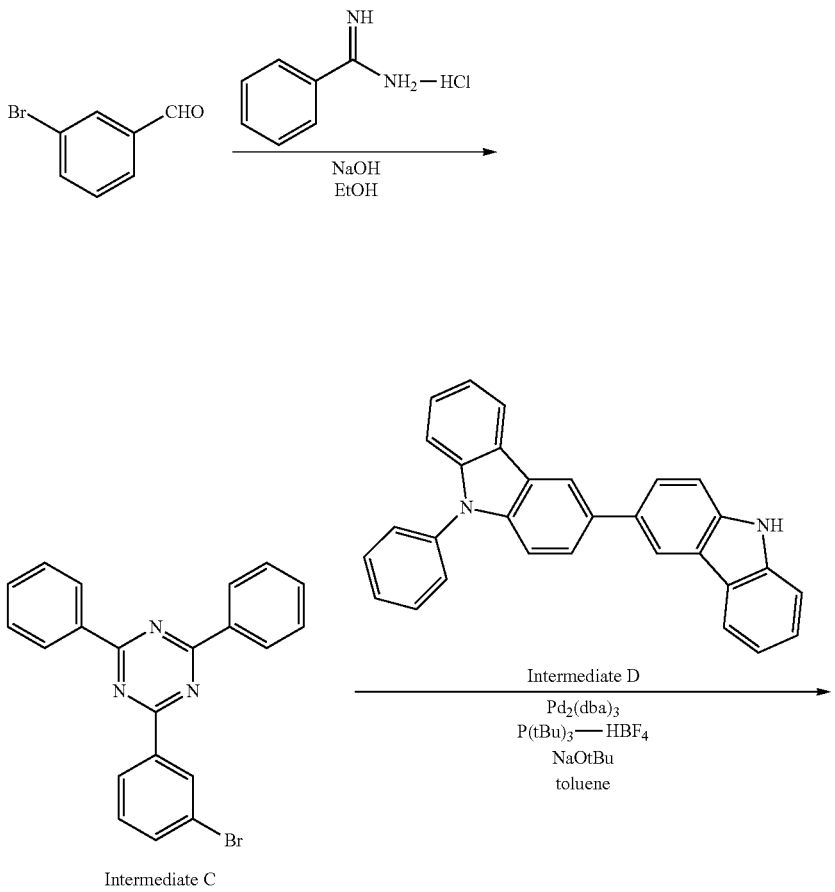

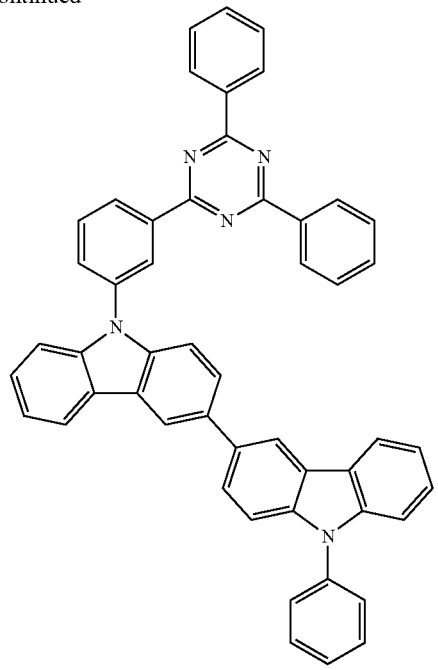

GH-2

Evaluation of Compounds (1) Singlet Energy EgS

Singlet Energy EgS was obtained by the following method.

A target compound to be measured was evaporated on a quartz substrate to prepare a sample. An absorption spectrum of the sample was measured at a normal temperature (300K). The absorption spectrum was expressed in coordinates of which ordinate axis indicated absorbance and of which abscissa axis indicated the wavelength. A tangent was drawn to the rise of the absorption spectrum on the long-wavelength side, and a wavelength value λedge (nm) at an intersection of the tangent and the abscissa axis was obtained. The wavelength value was converted to an energy value by the following conversion equation. The energy value was defined as EgS.

The conversion equation: EgS (eV)=1239.85/λedge

For the measurement of the absorption spectrum, a spectrophotometer (U3310 manufactured by Hitachi, Ltd.) was used.

The compounds GH-1, GH-2, GH-3 and CBP were measured. The measurement results of EgS of the compounds are shown in Table 1.

(2) Energy Gap $Eg_{77K}$ and Triplet Energy $EgT_D$ $Eg_{77K}$ and $EgT_D$ were obtained by the following method.

Each compound was measured by a known phosphorescence measurement method (a method described on or near page 50 of "Hikarikagaku no Sekai (The World of Photochemistry)" (edited by the Chemical Society of Japan, 1993). Specifically, each compound was dissolved in a solvent (EPA (diethylether:isopentane:ethanol=5:5:5 (volume ratio), a spectral grade solvent) to provide a sample for phosphorescence measurement (Sample 10 (μmol/liter)). The sample for phosphorescence measurement was put into a quartz cell, cooled to 77(K) and irradiated with excitation light, so that phosphorescence intensity was measured while changing a wavelength. The phosphorescence spectrum was expressed in coordinates of which ordinate axis indicated phosphorescence intensity and of which abscissa axis indicated the wavelength.

A tangent was drawn to the rise of the phosphorescent spectrum on the short-wavelength side, and a wavelength value λedge (nm) at an intersection of the tangent and the abscissa axis was obtained. The wavelength value was converted to an energy value by the following conversion equation. The energy value was defined as $Eg_{77K}$ or $EgT_D$.

The conversion equation: $Eg_{77K}$ (eV)=1239.85/λedge

The conversion equation: $EgT_{DK}$ (eV)=1239.85/λedge

For phosphorescence measurement, a spectrophotofluorometer body F-4500 and optional accessories for low temperature measurement (which were manufactured by Hitach High-Technologies Corporation) were used. The measurement instrument is not limited to this arrangement. A combination of a cooling unit, a low temperature container, an excitation light source and a light-receiving unit may be used for measurement.

The compounds GH-1, GH-2, GH-3 and CBP were measured with respect to $Eg_{77K}$. The measurement results of $Eg_{77K}$ of the compounds are shown in Table 1.

The compounds Ir(ppy)$_3$ and Ir(Ph-ppy)$_3$ were measured with respect to $EgT_D$. Measurement results of $EgT_D$ of the compounds are shown below.

Ir(ppy)$_3$: 2.62 (eV)

Ir(Ph-ppy)$_3$: 2.54 (eV)

(3) ΔST

ΔST was obtained as a difference between EgS and $Eg_{77K}$ measured in the above (1) and (2) (see the above formulae (1) and (3)). The results are shown in Table 1.

(4) ΔT

ΔT was obtained as a difference between $Eg_{77K}$ and $EgT_D$ measured in the above (1) and (2) (see the above formula (12)). The results are shown in Table 2.

31

(5) Δn

Δn was calculated based on the refractive index of each compound measured by the spectroscopic ellipsometry method. The spectroscopic ellipsometry method is a measurement method of an optical constant (i.e., a refractive index n and an extinction coefficient k) and a thickness of a thin film.

Figure 4A:
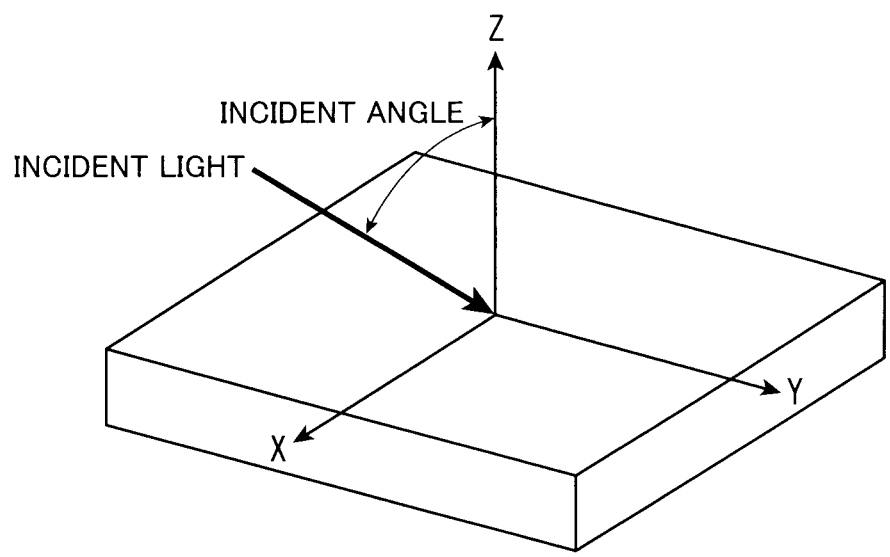
FIG. 4A shows an example of spectroscopic ellipsometry measurement.
Figure 4B:
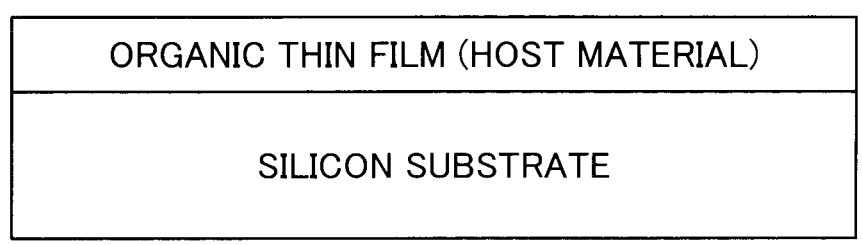
FIG. 4B shows a cross section of an organic thin film on a silicon substrate in which the organic thin film is to be measured in the spectroscopic ellipsometry measurement of FIG. 4A.

In this Example, a variable-incident-angle high-speed spectroscopic ellipsometer (manufactured by J. A. Woollam Co., Inc.: M-2000D) was used. FIG. 4 shows an example of spectroscopic ellipsometry measurement. FIG. 4A shows an incident angle of an incident light from a light source. FIG. 4B shows a cross section of an organic thin film (a measurement target) on a silicon substrate.

Each compound was evaporated on the silicon substrate (Si (100)) to form a 100-nm organic thin film. The organic thin film on the silicon substrate was irradiated with light at every five degrees in a range of 45 degrees to 80 degrees of the incident angle of the incident light from the light source while a wavelength of the light being changed at every 1.6 nm in a range of 245 nm to 1000 nm, thereby measuring ellipsometric parameters ψ and Δ. The obtained parameters were analyzed together using an analysis software WVASE32 (manufactured by J. A. Woollam Co., Inc) to examine optical anisotropy of the film. The anisotropy of the optical constant (i.e., the refractive index n and the extinction coefficient k) of the film reflects the anisotropy of molecular orientation in the film. The measurement method and the analysis methods are described in detail in the above Documents 7 to 9.

Δn was obtained as a difference between the refractive index n in the perpendicular direction z relative to the silicon substrate and the refractive index n in the parallel direction x relative to the silicon substrate (see the above formulae (5) and (7)). The perpendicular direction z and the parallel direction x relative to the silicon substrate are shown in FIG. 4A.

The compounds GH-1, GH-2 and GH-3 were measured with respect to Δn. CBP was cited from the following Document 10.

Document 10: Organic EL Symposium, proceeding for the sixth meeting edited by Daisuke Yokoyama et al., S2-2, p 5-6

The measurement results of Δn of the compounds are shown in Table 1.

(6) Half Bandwidth

A half bandwidth of photoluminescence spectrum was obtained as follows.

Each compound was dissolved in a solvent (dichloromethane) to prepare a sample for fluorescence measurement (Sample 10 (μmol/liter)). The sample for phosphorescence measurement was put into a quartz cell, cooled to 300(K) and irradiated with excitation light, so that fluorescence intensity was measured while changing a wavelength. The photoluminescence spectrum was expressed in coordinates of which ordinate axis indicated fluorescence intensity and of which abscissa axis indicated the wavelength. For fluorescence measurement, a spectrophotofluorometer F-4500 (manufactured by Hitachi High-Technologies Corporation) was used.

The half bandwidth (unit: nm) was measured based on the photoluminescence spectrum.

The compounds GH-1, GH-2, GH-3 and CBP were measured with respect to the half bandwidth. The measurement results of the half bandwidth of the compounds are shown in Table 1.

32

TABLE 1

| Material | Eg (eV) | Eg77K (eV) | ΔST (eV) | Δn | Half Bandwidth (nm) |
|---|---|---|---|---|---|
| GH-1 | 2.95 | 2.85 | 0.10 | 0.07 | 78 |
| GH-2 | 3.10 | 2.85 | 0.25 | 0.21 | 86 |
| GH-3 | 2.82 | 2.78 | 0.04 | 0.11 | 87 |
| CBP | 3.52 | 2.80 | 0.72 | 0.04 | 48 |

It was found that CBP known as a compound difficult to form an aggregate failed to satisfy the formula (1) or (3) with respect to ΔST and the formula (5) or (7) with respect to Δn, and had less than 75 nm of the half bandwidth of the photoluminescence spectrum.

(7) Electron Mobility

An electron mobility was evaluated using the impedance spectrometry. Al as the anode, the electron transporting layer material, LiF, and Al as the cathode were sequentially laminated on the substrate to prepare an electron-only device. DC voltage on which AC voltage of 100 mV was placed was applied thereon, and their complex modulus values were measured. When the frequency at which the imaginary part of the modulus was maximum was set at $f_{max}$ (Hz), a response time T (sec.) was calculated based on the equation $T=1/2/\pi/f_{max}$. Using this value, the dependence property of electron mobility on electric field intensity was determined.

The compounds ET-1 and Alq$_3$ were measured with respect to the electron mobility. The measurement results of the electron mobility at the electric field intensity of $500(V/cm)^{1/2}$ were as follows.

ET-1: $1 \times 10^{-5}$ cm$^2$/Vs

Alq$_3$: $3 \times 10^{-6}$ cm$^2$/Vs

Preparation and Evaluation of Organic EL Device

The organic EL device was prepared and evaluated as follows.

Example 1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes.

After the glass substrate having the transparent electrode line was cleaned, the glass substrate was mounted on a substrate holder of a vacuum evaporation apparatus. Initially, a compound HI-1 was evaporated on a surface of the glass substrate where the transparent electrode line was provided in a manner to cover the transparent electrode, thereby forming a 5-nm thick film of the compound HI-1. The HI-1 film serves as a hole injecting layer.

After the film formation of the HI-1 film, a compound HT-1 was evaporated on the HI-1 film to form a 120-nm thick HT-1 film. Moreover, a compound HT-2 was evaporated on the HT-1 film to form a 46.5-nm thick HT-2 film. The HT-1 film and the HT-2 film serve as a hole transporting layer.

Then, a compound GH-1 (a host material) and a compound Ir(ppy)$_3$ (a phosphorescent dopant material) were co-evaporated on the HT-2 film to form a 40-nm thick emitting layer. The concentration of the dopant material was set at 10 mass %.

The electron transporting compound ET-1 and Liq were co-evaporated on the emitting layer to form a 20-nm thick electron transporting layer. The concentration of Liq was set at 50 mass %.

Liq was evaporated on the electron transporting layer to form a 1-nm thick Liq film.

A metal Al was evaporated on the Liq film to form an 80-nm thick metal cathode.

Thus, the organic EL device of Example 1 was prepared.

A device arrangement of the organic EL device in Example 1 is schematically shown as follows.

ITO/HI-1(5)/HT-1(120)/HT-2(46.5)/GH-1:Ir(ppy)$_3$(40, 10%)/ET-1:Liq(20, 50%)/Liq(1)/Al(80)

Numerals in parentheses represent a film thickness (unit: nm). Numerals represented by percentage in the same parentheses represent a ratio (mass %) of an added component such as the phosphorescent dopant material in the emitting layer.

Examples 2 to 4 and Comparatives 1 to 2

Except that the compounds shown in Table 2 were used as the emitting layer, organic EL devices of Examples 2 to 4 and Comparatives 1 to 2 were prepared in the same manner as in the Example 1.

Table 2 includes a part of the measurement results shown in Table 1 for comparison purpose.

TABLE 2

| | Host | | | | | Dopant | | | Luminous Efficiency |
|---|---|---|---|---|---|---|---|---|---|
| | Material | EgS(eV) | Eg$_{77K}$(eV) | ΔST(eV) | Δn | Half Bandwidth (nm) | Material | EgT(eV) | ΔT(eV) | (cd/A) |
| Example 1 | GH-1 | 2.95 | 2.85 | 0.10 | 0.07 | 78 | Ir(ppy)$_3$ | 2.62 | 0.23 | 65.4 |
| Example 2 | GH-2 | 3.10 | 2.85 | 0.25 | 0.21 | 86 | Ir(ppy)$_3$ | 2.62 | 0.23 | 54.2 |
| Example 3 | GH-1 | 2.95 | 2.85 | 0.10 | 0.07 | 78 | Ir(Ph-ppy)$_3$ | 2.54 | 0.31 | 70.6 |
| Example 4 | GH-2 | 3.10 | 2.85 | 0.25 | 0.21 | 86 | Ir(Ph-ppy)$_3$ | 2.54 | 0.31 | 57.7 |
| Comp. 1 | GH-3 | 2.82 | 2.78 | 0.04 | 0.11 | 87 | Ir(ppy)$_3$ | 2.62 | 0.16 | 46.9 |
| Comp. 2 | GH-3 | 2.82 | 2.78 | 0.04 | 0.11 | 87 | Ir(Ph-ppy)$_3$ | 2.54 | 0.24 | 25.9 |

Evaluation of Organic EL Device

The prepared organic EL devices were evaluated with respect to the luminous efficiency. The results are shown in Table 2.

The luminous efficiency (a current efficiency) was measured as follows.

Voltage was applied on each of the organic EL devices such that a current density was 10 mA/cm$^2$, where spectral-radiance spectrum was measured by a spectroradiometer (CS-1000 manufactured by Konica Minolta Holdings, Inc.). The luminous efficiency (unit: cd/A) was calculated from the obtained spectral-radiance spectra.

As shown in Table 2, the organic EL devices of Examples 1 to 4 were superior to the organic EL devices of Comparatives 1 and 2.

With respect to the host material GH-3 of the organic EL devices of Comparatives 1 and 2, ΔST was less than 0.4 eV, Δn was more than 0.04 and the half bandwidth of the photoluminescence spectrum was more than 75 nm, but EgS was less than 2.9 eV and Eg$_{77K}$ was less than 0.85 eV. Accordingly, the host material GH-3 does not satisfy the requirements of the host material of the invention. Consequently, the luminous efficiency was inferior to those of Examples.

In consideration of the above, in order to obtain a phosphorescent organic EL device having a high luminous efficiency, it was found important that the host material for the emitting layer was required to be selected from a compound having large EgS and Eg$_{77K}$ in addition to satisfying the above requirements on ΔST, Δn or the half bandwidth of the photoluminescence spectrum. Moreover, when such a compound was used as the host material in the emitting layer and the electron transporting layer formed of the compound ET-1 having a larger electron mobility than that of Alq$_3$ is provided adjacently to the emitting layer, the organic EL device exhibited a high luminous efficiency.

Example 5

An organic EL device of Example 5 was prepared as follows.

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes.

After the glass substrate having the transparent electrode line was cleaned, the glass substrate was mounted on a substrate holder of a vacuum evaporation apparatus. Initially, a compound HI-1 was evaporated on a surface of the glass substrate where the transparent electrode line was provided in a manner to cover the transparent electrode, thereby forming a 5-nm thick film of the compound HI-1. The HI-1 film serves as a hole injecting layer.

After the film formation of the HI-1 film, a compound HT-1 was evaporated on the HI-1 film to form a 90-nm thick HT-1 film. Moreover, a compound HT-2 was evaporated on the HT-1 film to form a 46.5-nm thick HT-2 film. The HT-1 film and the HT-2 film serve as a hole transporting layer.

A compound PBH-1 (a host material) and a compound PBD-1 (a phosphorescent dopant material) were co-evaporated on the HT-2 film to form a 30-nm thick emitting layer. The concentration of the dopant material was set at 20 mass %.

The compound PBH-1 was evaporated on the emitting layer to form a 5-nm thick PBH-1 film.

Next, the compound ET-1 and Liq were co-evaporated on the PBH-1 film to form a 30-nm thick electron transporting layer. The concentration of Liq was set at 50 mass %.

Liq was evaporated on the electron transporting layer to form a 1-nm thick Liq film.

A metal Al was evaporated on the Liq film to form an 80-nm thick metal cathode.

Thus, the organic EL device of Example 5 was prepared.

A device arrangement of the organic EL device in Example 5 is schematically shown as follows.

ITO/HI-1(5)/HT-1(90)/HT-2(46.5)/PBH-1:PBD-1(30, 20%)/PBH-1(5)/ET-1:Liq(30, 50%)/Liq(1)/Al(80)

Numerals in parentheses represent a film thickness (unit: nm). Numerals represented by percentage in the same parentheses represent a ratio (mass %) of an added component such as the phosphorescent dopant material in the emitting layer.

A synthesis scheme of the compound GH-1 is shown below.

In Example 5, the following compounds were used in addition to the aforementioned compounds.

PBH-1

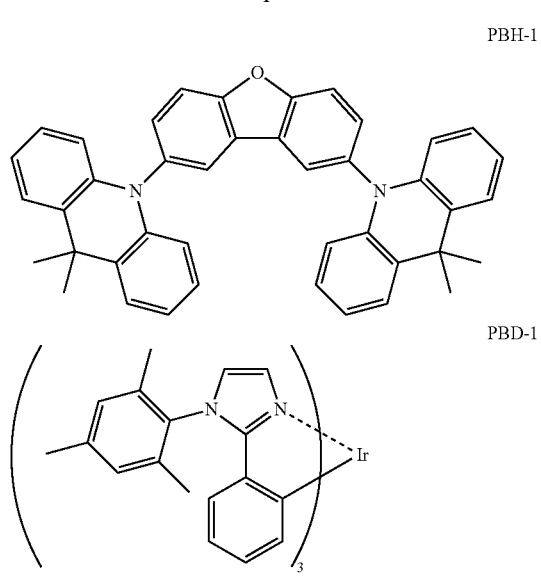

PBD-1

-continued

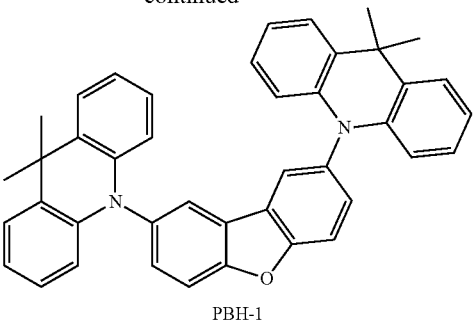

PBH-1

The compound PBH-1 was evaluated in the same manner as the above. The results are shown in Table 3.

TABLE 3

| Host Material | EgS (eV) | $Eg_{77K}$ (eV) | ΔST (eV) |
|---|---|---|---|
| PBH-1 | 3.06 | 3.05 | 0.01 |

The compound PBD-1 was measured with respect to the triplet energy $EgT_D$ in the same manner as the above. The obtained triplet energy $EgT_D$ was 2.82 eV.

The difference ΔT between $Eg_{77K}$ of the compound PBH-1 (the host material) and $EgT_D$ of the compound PBD-1 (the dopant material) in Example 5 was obtained as follows according to the formula (12).

$\Delta T = Eg_{77K} - EgT_D = 3.05 - 2.82 = 0.23$ (eV)

The prepared organic EL device of Example 5 was evaluated with respect to the drive voltage and the luminous efficiency. The results are shown in Table 4.

Drive Voltage

Voltage was applied between ITO (anode) and Al (cathode) such that a current density was 10 mA/cm², where the voltage (unit: V) was measured.

Luminous Efficiency (Current Efficiency)

Voltage was applied on each of the organic EL devices such that a current density was 10 mA/cm², where spectral-radiance spectrum was measured by a spectroradiometer (CS-1000 manufactured by Konica Minolta Holdings, Inc.). The luminous efficiency (unit: cd/A) was calculated from the obtained spectral-radiance spectra.

Synthesis of Compound(s)

Synthesis Example 3

Synthesis of PBH-1

Under an argon gas atmosphere, an intermediate E (3.3 g, 10 mmol) synthesized according to the method described in International Publication No. 2009/008100 (WO2009/008100 A1), an intermediate F (6.1 g, 30 mmol) synthesized according to the method described in JP-A-2010-180204, tris(dibenzylidene acetone)dipalladium (0.37 g, 0.4 mmol), tri-t-butylphosphonium tetrafluoroborate (0.46 g, 1.6 mmol), t-butoxysodium (7.7 g, 80 mmol) and anhydrous toluene (50 ml) were sequentially added and refluxed for eight hours with stirring.

The reaction solution was condensed under reduced pressure. The obtained residue was refined by silica-gel column chromatography (hexane/toluene=7/3 (volume ratio)). The residue was further refined by recrystallization using hexane to obtain a white solid of the compound PBH-1 (4.0 g, a yield of 69%).

As a result of FD-MS analysis, m/e was equal to 582 (a measured value) while a calculated molecular weight was 582, whereby the obtained compound was identified to be the compound PBH-1.

TABLE 4

| | Drive Voltage (V) | Luminous Efficiency (cd/A) |
|---|---|---|
| Example 5 | 5.87 | 32.6 |

What is claimed is:

1. An organic electroluminescence device comprising: a pair of electrodes; and an organic compound layer between the pair of electrodes, the organic compound layer comprising an emitting layer comprising a host material and a phosphorescent dopant material, wherein
the host material is selected from a compound satisfying the following formula (1) with respect to a difference AST between singlet energy EgS and an energy gap $Eg_{77K}$ at 77K and satisfying the following formula (2) with respect to the singlet energy EgS:

$\Delta ST = EgS - Eg_{77K} < 0.4$ (eV)  (1)

$EgS \geq 2.90$ (eV)  (2).

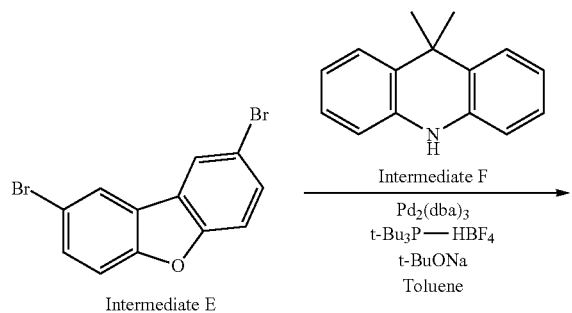

Intermediate E

Intermediate F

Pd₂(dba)₃
t-Bu₃P—HBF₄
t-BuONa
Toluene

2. An organic electroluminescence device comprising: a pair of electrodes; and an organic compound layer between the pair of electrodes, the organic compound layer comprising an emitting layer comprising a host material and a phosphorescent dopant material, wherein the host material is selected from a compound satisfying the following formula (3) with respect to a difference ΔST between singlet energy EgS and an energy gap $Eg_{77K}$ at 77K and satisfying the following formula (4) with respect to the energy gap $Eg_{77K}$:

$$\Delta ST = EgS - Eg_{77K} < 0.4 \text{ (eV)} \tag{3}$$

$$Eg_{77K} \geq 2.85 \text{ (eV)} \tag{4}$$

3. An organic electroluminescence device comprising: a pair of electrodes; and an organic compound layer between the pair of electrodes, the organic compound layer comprising an emitting layer comprising a host material and a phosphorescent dopant material, wherein the host material is selected from a compound satisfying the following formula (5) with respect to a refractive index $n_Z$ in a direction perpendicular to a silicon substrate surface and a refractive index $n_X$ in a direction parallel to the silicon substrate surface by a spectroscopic ellipsometry and satisfying the following formula (6) with respect to singlet energy EgS:

$$\Delta n = |n_X - n_Z| > 0.04 \tag{5}$$

$$EgS \geq 2.90 \text{ (eV)} \tag{6}$$

4. An organic electroluminescence device comprising: a pair of electrodes; and an organic compound layer between the pair of electrodes, the organic compound layer comprising an emitting layer comprising a host material and a phosphorescent dopant material, wherein the host material is selected from a compound satisfying the following formula (7) with respect to a refractive index $n_Z$ in a direction perpendicular to a silicon substrate surface and a refractive index $n_X$ in a direction parallel to the silicon substrate surface by a spectroscopic ellipsometry and satisfying the following formula (8) with respect to an energy gap $Eg_{77K}$ at 77K:

$$\Delta n = |n_X - n_Z| > 0.04 \tag{7}$$

$$Eg_{77K} \geq 2.85 \text{ (eV)} \tag{8}$$

5. An organic electroluminescence device comprising: a pair of electrodes; and an organic compound layer between the pair of electrodes, the organic compound layer comprising an emitting layer comprising a host material and a phosphorescent dopant material, wherein the host material is selected from a compound having more than 75 nm of a half bandwidth of photoluminescence spectrum and satisfying the following formula (9) with respect to singlet energy EgS:

$$EgS \geq 2.90 \text{ (eV)} \tag{9}$$

6. An organic electroluminescence device comprising a pair of electrodes and an organic compound layer between the pair of electrodes, the organic compound layer comprising an emitting layer comprising a host material and a phosphorescent dopant material, wherein the host material is selected from a compound having more than 75 nm of a half bandwidth of photoluminescence spectrum and satisfying the following formula (10) with respect to an energy gap $Eg_{77K}$ at 77K:

$$Eg_{77K} \geq 2.85 \text{ (eV)} \tag{10}$$

7. The organic electroluminescence device according to claim 1, wherein the host material is selected from a compound having more than 75 nm of a half bandwidth of photoluminescence spectrum.

8. The organic electroluminescence device according to claim 1, wherein the difference ΔST satisfies the following formula (11):

$$\Delta ST = EgS - Eg_{77K} < 0.3 \text{ (eV)} \tag{11}$$

9. The organic electroluminescence device according to claim 1, wherein a difference ΔT between triplet energy $EgT_D$ of the phosphorescent dopant material and the energy gap $Eg_{77K}$ at 77K of the host material satisfies the following formula (12):

$$\Delta T = Eg_{77K} - EgT_D > 0.20 \text{ (eV)} \tag{12}$$

10. The organic electroluminescence device according to claim 1, wherein the pair of electrodes are an anode and a cathode, an electron transporting layer is provided between the organic compound layer and the cathode, and an electron mobility of the electron transporting layer is $5 \times 10^{-6}$ cm$^2$/Vs or more in an electric field intensity of $500(V/cm)^{1/2}$.

11. The organic electroluminescence device according to claim 1, wherein the host material comprises at least one of skeletons represented by the following formulae (1) to (8):

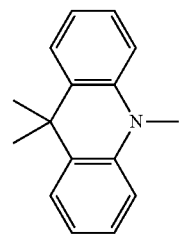

(1)

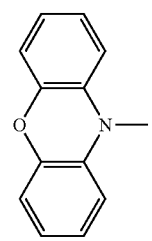

(2)

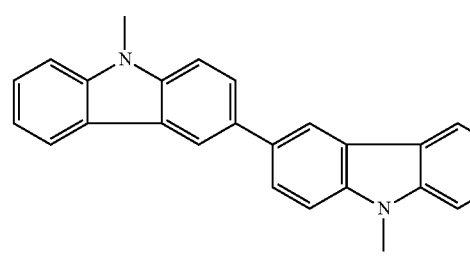

(3)

-continued (4)
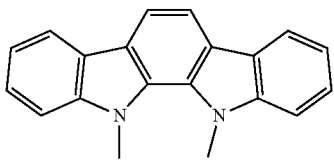

(5)
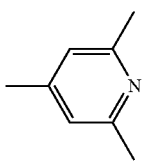

(6)
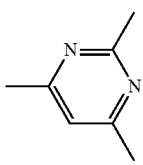

(7)
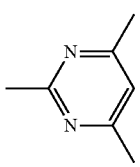

(8)
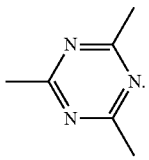

12. The organic electroluminescence device according to claim 2, wherein
the host material is selected from a compound having more than 75 nm of a half bandwidth of photoluminescence spectrum.

13. The organic electroluminescence device according to claim 2, wherein the difference AST satisfies the following formula (13):

$$\Delta ST = EgS - Eg_{77K} < 0.3 \text{ (eV)} \qquad (13).$$

14. The organic electroluminescence device according to claim 7, wherein the difference AST satisfies the following formula (14):

$$\Delta ST = EgS - Eg_{77K} < 0.3 \text{ (eV)} \qquad (14).$$

15. The organic electroluminescence device according to claim 2, wherein a difference AT between triplet energy $EgT_D$ of the phosphorescent dopant material and the energy gap $Eg_{77K}$ at 77K of the host material satisfies the following formula (15):

$$\Delta T = Eg_{77K} - EgT_D > 0.20 \text{ (eV)} \qquad (15),$$

16. The organic electroluminescence device according to claim 2, wherein the pair of electrodes are an anode and a cathode,
an electron transporting layer is provided between the organic compound layer and the cathode, and
an electron mobility of the electron transporting layer is $5 \times 10^{-6}$ cm$^2$/Vs or more in an electric field intensity of $500$(V/cm)$^{1/2}$.

17. The organic electroluminescence device according to claim 2, wherein the host material comprises at least one of skeletons represented by the following formulae (1) to (8):

(1)
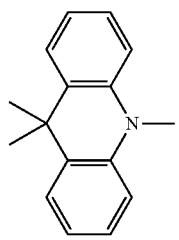

(2)
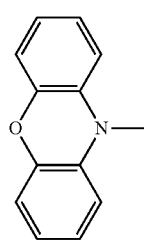

(3)
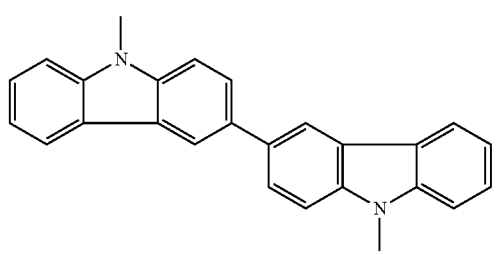

(4)
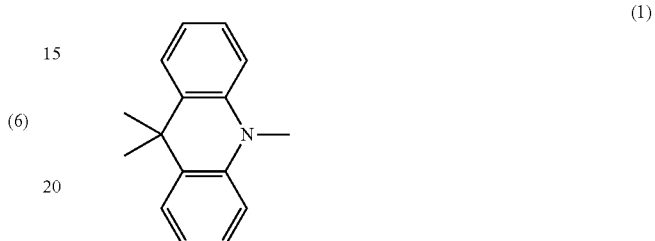

(5)
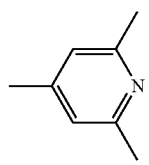

-continued (6) 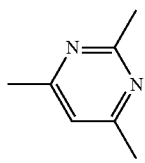

(7) 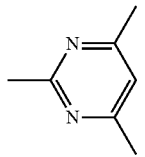

(8) 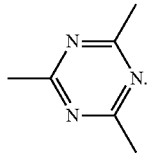

and the phosphorescent dopant material is:

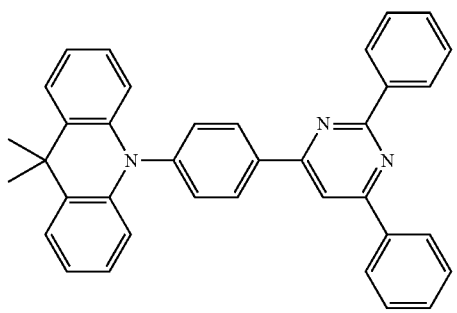 GH-1

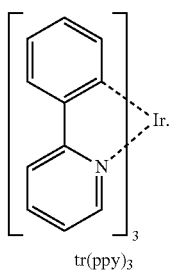
tr(ppy)₃

18. The organic electroluminescence device according to claim 1, wherein the difference AST satisfies the formula $\Delta ST = EgS - Eg_{77K} \leq 0.25$ (eV).

19. The organic electroluminescence device according to claim 2, wherein the difference AST satisfies the formula $\Delta ST = EgS - Eg_{77K} \leq 0.25$ (eV).

20. The organic electroluminescence device according to claim 1, wherein the host material is:

* * * * *